(12) United States Patent
Goto

(10) Patent No.: US 6,535,902 B2
(45) Date of Patent: Mar. 18, 2003

(54) MULTIPLIER CIRCUIT FOR REDUCING THE NUMBER OF NECESSARY ELEMENTS WITHOUT SACRIFICING HIGH SPEED CAPABILITY

(75) Inventor: Gensuke Goto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 198 days.

(21) Appl. No.: 09/822,411

(22) Filed: Apr. 2, 2001

(65) Prior Publication Data

US 2001/0016865 A1 Aug. 23, 2001

Related U.S. Application Data

(62) Division of application No. 09/287,098, filed on Apr. 7, 1999, now Pat. No. 6,240,438, which is a continuation of application No. 08/794,495, filed on Feb. 4, 1997, now Pat. No. 5,920,498.

(30) Foreign Application Priority Data

Aug. 29, 1996 (JP) .............................. 8-228618
Oct. 18, 1996 (JP) .............................. 8-276148

(51) Int. Cl.[7] ................................................. G06F 7/52
(52) U.S. Cl. ...................................................... 708/629
(58) Field of Search ................................. 708/629, 708

(56) References Cited

U.S. PATENT DOCUMENTS

| 4,441,158 | A |   | 4/1984 | Kanuma |          |
|-----------|---|---|--------|--------|----------|
| 4,601,007 | A |   | 7/1986 | Uya et al. | 364/784.03 |
| 4,901,270 | A | * | 2/1990 | Galbi et al. | 708/627 |
| 5,040,139 | A |   | 8/1991 | Tran   | 708/628 |
| 5,151,875 | A |   | 9/1992 | Sato   |          |
| 5,426,598 | A | * | 6/1995 | Hagihara | 708/62.7 |
| 5,734,601 | A |   | 3/1998 | Chu    | 708/630 |
| 5,805,491 | A | * | 9/1998 | Bechade | 708/629 |
| 5,808,928 | A | * | 9/1998 | Miyoshi | 708/629 |
| 5,818,747 | A | * | 10/1998 | Wong  | 708/702 |
| 5,903,484 | A | * | 5/1999 | Tsujihashi | 709/620 |

FOREIGN PATENT DOCUMENTS

| EP | 0 398 568 | 11/1990 |
| EP | 0447254 A2 | 3/1991 |
| EP | 0 529 755 | 3/1993 |
| EP | 0 545 654 | 6/1993 |
| EP | 0 692 762 | 1/1996 |
| FR | 2 611 286 | 8/1988 |
| JP | 57-031042 | 2/1982 |
| JP | 57-121736 | 7/1982 |
| JP | 58-211252 | 12/1983 |
| JP | 59-3634 | 1/1984 |
| JP | 59-211138 | 11/1984 |
| JP | 61-262928 | 11/1986 |
| JP | 2-112020 | 4/1990 |

(List continued on next page.)

OTHER PUBLICATIONS

Japanese Office Action, Dated Jul. 15, 2002 (Japanese Office Action Translation) Notice Requesting Submission of Opinion, Delivery No.: 9–5–2002–025092376, Delivery Date: Jul. 15, 2002, Response Deadline: Sep. 15, 2002.

(List continued on next page.)

Primary Examiner—Tan V. Mai
(74) Attorney, Agent, or Firm—Arent Fox Kintner Plotkin & Kahn, PLLC

(57) ABSTRACT

A multiplier circuit has an encoder and a partial product bit generating circuit. The encoder receives a multiplier bit signal arid is used to output a plurality of encode signals. The partial product bit generating circuit receives the encode signals along with a multiplicand bit signal from each digit place and is used to generate a partial product bit for each digit place. The partial product bit generating circuit has a first selection circuit which is used to select a logically true signal from among the encode signals in accordance with a value of the multiplicand bit signal. Therefore, the circuit can be reduced in size by reducing the number of necessary elements without sacrificing its high speed capability.

16 Claims, 19 Drawing Sheets

FOREIGN PATENT DOCUMENTS

| | | |
|---|---|---|
| JP | 55-105732 | 8/1990 |
| JP | 3-271932 | 12/1991 |
| JP | 4-92920 | 3/1992 |
| JP | 4-167127 | 6/1992 |
| JP | 4-227534 | 8/1992 |
| JP | 4-287220 | 10/1992 |
| JP | 5-88852 | 4/1993 |
| JP | 5-108308 | 4/1993 |
| WO | 85/05705 | 12/1985 |

OTHER PUBLICATIONS

IBM Technical Disclosure Bulletin, "Four –Input Carry Save Adder Tree", vol. 32, No. 32A, Aug. 1989, pp. 164–165.

IEICE Transactions on Electronics, "4–2 Compressor with Complementary Pass–Transistor Logic", vol. E77–C, No. 4, Apr. 1, 1994, pp. 647–649.

1996 General Convention of the Institute of Electronics, Information and Communication Engineers, General Lecture C–541 (A Collection of Lecture Papers, Electronics 2, p. 157), "The Method for a High–Speed Booth–Wallace Multiplier".

IEEE Journal of Solid State Circuits, vol. 27, No. 9, Sep. 1992, A 54×54–b Regularly Structured Tree Multiplier.

Lo et al., "A New Design of an Iterative Array for Multiplication of Signed Binary and Quaternary Digital Number Systems", IEEE, 12th International Symposium on Multiple–Valued Logic, May 25–27, France, pp. 99–106.

"Booth Encoder/Selector Comparator for High Speed Multiplier", IBM Technical Disclosure Bulletin, vol. 30, No. 7, Dec. 1, 1987, pp. 144–147.

M.B. Richard et al., "Fast–LSI, A Second Generation Advanced Schottky Technology", Electro, vol. 9, NR. 2, May 15, 1984, pp. 1–9.

IEEE Journal of Solid State Circuits, vol. 30, No. 3, Mar. 1995, "A 4.4 ns CMOS 54×54–b Multiplier m Using Pass–Transistor Multiplexer".

* cited by examiner

Fig. 19

MULTIPLIER CIRCUIT FOR REDUCING THE NUMBER OF NECESSARY ELEMENTS WITHOUT SACRIFICING HIGH SPEED CAPABILITY

This is a Division of application Ser. No. 09/287,098 filed Apr. 7, 1999; U.S. Pat. No. 6,248,430 which in turn is a Continuation Application of parent application Ser. No. 08/794,495 filed Feb. 4, 1997 U.S. Pat. No. 5,920,498. The disclosure of the prior application(s) is hereby incorporated by reference herein in its entirety.

BACKGROUND OF THE INVENTION

1. Field of the Invention

The present invention relates to a multiplier circuit, an adder circuit constituting part of the multiplier circuit, a partial product bit compression method for the multiplier circuit, and a large-scale semiconductor integrated circuit using the multiplier circuit, and more particularly, to a multiplier circuit which is reduced in size by reducing the number of necessary elements without sacrificing its high speed capability.

2. Description of the Related Art

In recent years, with rapid advances in manufacturing and design technologies of large-scale semiconductor integrated circuits, exemplified by microprocessors and digital signal processors, a demand for high-speed, large-scale arithmetic circuits has been increasing. In particular, for multiplier circuits that require long calculation times and a larger number of circuits, high-speed circuits with reduced number of elements are needed.

The prior arts and their associated problems will be described in detail later with reference t the accompanying drawings.

SUMMARY OF THE INVENTION

An object of the present invention is to provide a multiplier circuit which is reduced in size by reducing the number of necessary elements without sacrificing its high speed capability. More specifically, a first object of the invention is to provide a partial product bit generating circuit (multiplier circuit) that can reduce the number of necessary elements by half, and an encoder (Booth encoder) suitable for implementing the partial product bit generating circuit. A second object of the invention is to provide an adder circuit (4-2 compression circuit: multiplier circuit), specifically a carry-save adder circuit with four inputs for each digit place (4-2 compression circuit), that can be constructed with 50 or less elements as compared with prior art implementations requiring more than 50 elements. A third object of the invention is to provide a partial product bit compression method for reducing the number of partial product bits for each digit place, that can shorten the critical path in partial bit compression processing without increasing the number of necessary elements compared with the prior art.

According to the present invention, there is provided an adder circuit which takes, for each digit place, four input signals and one intermediate carry-in signal, and generates one intermediate carry-out signal along with a sum signal and a carry signal for output, wherein an OR or NOR signal and an exclusive-OR signal of a first input signal and a second input signal from the same digit place are formed, and when the exclusive-OR signal is a first value, a third input signal from the same digit place is output as the intermediate carry-out signal, while when the exclusive-OR signal is a second value, the OR or NOR signal is output as the intermediate carry-out signal.

Further, according to the present invention, there is provided an adder circuit which takes, for each digit place, four input signals and one intermediate carry-in signal, and generates one intermediate carry-out signal along with a sum signal and a carry signal for output, wherein an AND or NAND signal and an exclusive-OR signal of a first input signal and a second input signal from the same digit place are formed, and when the exclusive-OR signal is a first value, a third input signal from the same digit place is output as the intermediate carry-out signal, while when the exclusive-OR signal is a second value, the AND or NAND signal is output as the intermediate carry-out signal.

A circuit for generating the sum signal by exclusive-ORing the five input signals may comprise a first exclusive-OR circuit, constructed from a single-transfer-gate circuit, for exclusive-ORing the exclusive-OR signal of the first and second input signals with the exclusive-OR signal of the third and fourth signals from the same digit place; and a plurality of second exclusive-OR circuits, each constructed from a drive gate circuit or a complementary-transfer-gate circuit, for exclusive-ORing the other signals. The first exclusive-OR circuit may comprise six transistors.

In addition, according to the present invention, there is provided an adder circuit which takes, for each digit place, four input signals and one intermediate carry-in signal, and generates one intermediate carry-out signal along with a sum signal and a carry signal for output, wherein a circuit for generating the sum signal by exclusive-ORing the five input signals comprises a first exclusive-OR circuit, constructed from a single-transfer-gate circuit, for exclusive-ORing the exclusive-OR signal of the first and second input signals with the exclusive-OR signal of the third and fourth signals from the same digit place; and a plurality of second exclusive-OR circuits, each constructed from a drive gate circuit or a complementary-transfer-gate circuit, for exclusive-ORing the other signals.

The adder circuit may be included in a digital multiplier circuit.

According to the present invention, there is also provided a multiplier circuit comprising an encoder for receiving a multiplier bit signal and for outputting a plurality of encode signals; and a partial product bit generating circuit for receiving the encode signals along with a multiplicand bit signal from each digit place and for generating a partial product bit for each digit place, the partial product bit generating circuit including a first selection circuit for selecting a logically true signal from among the encode signals in accordance with a value of the multiplicand bit signal.

The multiplicand bit signal and its inverted signal may be supplied to the partial product bit generating circuit. The encoder may be a Booth encoder. The encode signals to be selected by the first selection circuit may be signals identifying whether a necessary signal as an encoded result is the multiplicand bit signal itself or its inverted signal.

The partial product bit generating circuit may be loaded with multiplicand bit signals from a plurality of digit places; and the partial product bit generating circuit may further include a second selection circuit for selecting, from among the plurality of signals selected based on each multiplicand bit signal, a signal that matches the result of encoding in accordance with an encode signal different from the selected signals.

Each of the first and second selection circuits may be constructed from two AND circuits and one NOR circuit.

Each of the first and second selection circuits may be constructed from transfer gates. Each of the first and second selection circuits may be constructed from two transfer gates.

The multiplicand bit signal lines for transferring complementary multiplicand bit signals corresponding to multiplicand digits may be arranged in parallel to each other extending in a first direction in a two-dimensional plane, and sets of encode signal lines corresponding to multiplier digits may be arranged extending in a second direction that intersects the first direction, while the partial product bit generating circuit is repeatedly arranged in order to contain a plurality of predetermined adjacent intersections of the multiplicand bit signal lines and the encode signal lines.

Further, according to the present invention, there is provided a multiplier circuit utilizing a Booth algorithm, comprising a circuit which, instead of a partial product bit signal in accordance with the Booth algorithm, generates for each digit place a bit signal corresponding to a sum of a correction value for twos complement of a most significant partial product and a binary number represented by a bit in a sign digit of a least significant partial product and bits from a least significant digit of the most significant partial product to a digit one position lower than the sign digit of the least significant partial product.

Further, according to the present invention, there is also provided a multiplier circuit utilizing a method for avoiding sign extension by correction processing, comprising a circuit which performs addition of one for sign correction in a digit place one position higher than a sign digit of each partial product, wherein an intermediate carry-out signal as a summation output for a digit place containing the sign digit, or a carry signal itself, is added in a digit place two positions higher, and a NOT signal thereof is added in a digit place one position higher.

In addition, according to the present invention, there is provided a multiplier circuit utilizing a Booth algorithm and also utilizing a method for avoiding sign extension by correction processing, comprising a circuit which, instead of a partial product bit signal in accordance with the Booth algorithm, generates for each digit place a bit signal corresponding to a sum of a correction value for twos complement of a most significant partial product and a binary number represented by a bit in a sign digit of a least significant partial product and bits from a least significant digit of the most significant partial product to a digit one position lower than the sign digit of the least significant partial product; and a circuit which performs addition of a 1 for sign correction in a digit place one position higher than a sign digit of each partial product, wherein an intermediate carry-out signal as a summation output for a digit place containing the sign digit, or a carry signal itself, is added in a digit place two positions higher, and a NOT signal thereof is added in a digit place one position higher.

The multiplier circuit may be integrated together with additional circuitry for implementing signal processing functions, and may constitute a large-scale semiconductor integrated circuit.

BRIEF DESCRIPTION OF THE DRAWINGS

The present invention will be more clearly understood from the description of the preferred embodiments as set forth below with reference to the accompanying drawings, wherein;

FIG. 19 is a diagram for explaining an example of a partial product bit compression method for the multiplier circuit according to the present invention;

DESCRIPTION OF THE PREFERRED EMBODIMENTS

Figures 1, 2:
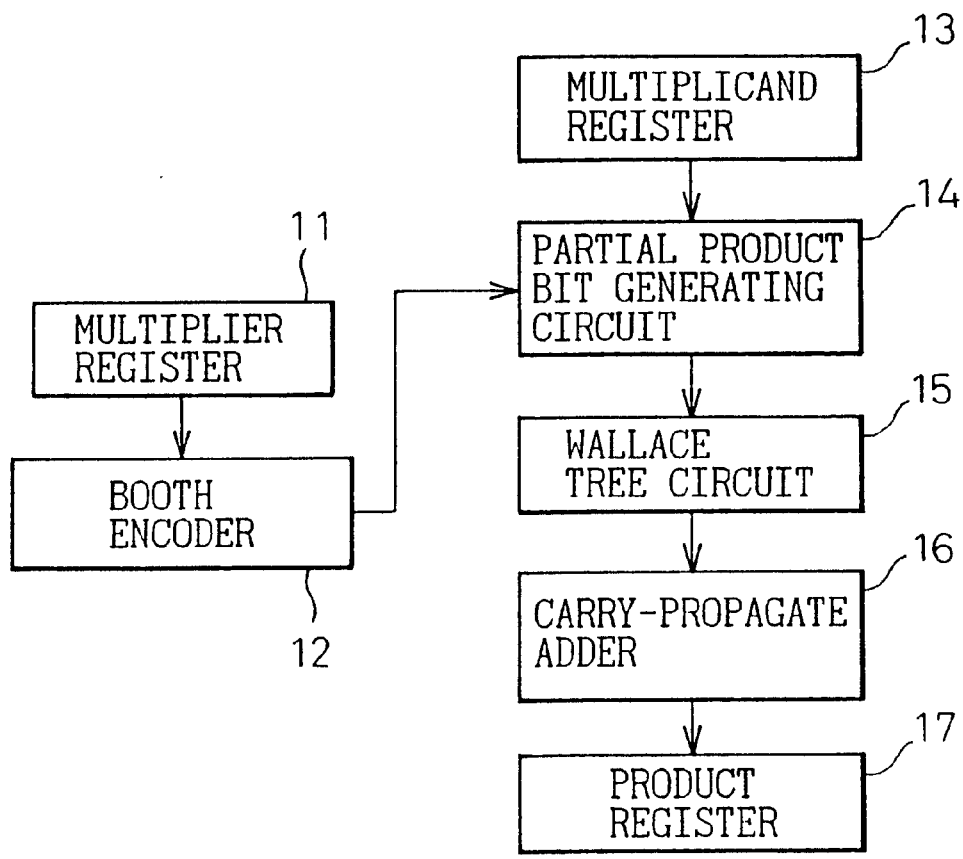
FIG. 1 is a block diagram schematically showing an example of a multiplier circuit.
FIG. 2 is a circuit diagram showing an example of a partial product bit generating circuit in a prior art multiplier circuit.
Figure 3:
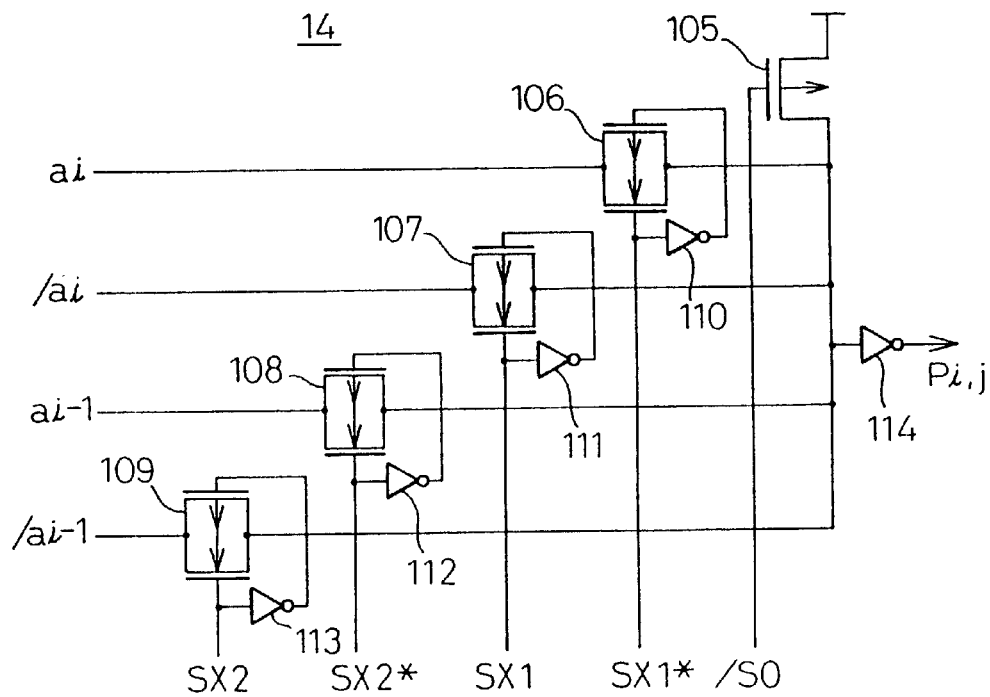
FIG. 3 is a circuit diagram showing another example of the partial product bit generating circuit in the prior art multiplier circuit.

Before proceeding to a detailed description of the preferred embodiments of the present invention, we will first describe the prior art and its associated problems with reference to FIGS. 1 to 3.

It is well known to use a Booth algorithm in conjunction with a Wallace tree to implement a high-speed multiplier circuit with reduced number of elements.

FIG. 1 is a block diagram schematically showing an example of such a multiplier circuit. In FIG. 1, reference numeral 11 is a multiplier register, 12 is a Booth encoder, 13 is a multiplicand register, 14 is a partial product bit generating circuit, 15 is a Wallace tree circuit, 16 is a carry-propagate adder circuit, and 17 is a product register.

As shown in FIG. 1, each multiplier bit output from the multiplier register 11 is input as an encode signal to the partial product bit generating circuit 14 via the Booth encoder 12. On the other hand, a multiplicand bit signal (13) is input directly to the partial product bit generating circuit 14.

The partial product bit generating circuit 14 generates partial product bits for each digit place from sets of multiplicand bit signals and encode signals. The resulting product bit signals, after appropriate shifting, are input to a multi-stage carry-save adder circuit (4-2 compression circuit, 1-bit adder circuit, etc.) constituting the Wallace tree circuit 15, for reduction of bits in each digit column, and are recursively added until the number of summand bits becomes 2 for the same column. When the number of bits is reduced to 2 for each column, the resulting signals are input to the carry-propagate adder circuit 16 where ordinary two-input addition is performed, and a product signal for each digit place is generated and is loaded into the product register 17.

In the multiplier circuit configuration shown in FIG. 1, the Booth encoder (the encoder), the partial product bit generating circuit, and the Wallace tree circuit must be considered separately.

First, the encoder and the partial product bit generating circuit will be described. Both of these circuits are related to each other and, therefore, need to be considered together. A specific example of an encoder based on a (modified) second-order Booth algorithm is disclosed, for example, in Japanese Unexamined Patent Publication (Kokai) No. 55-105732.

FIG. 2 is a circuit diagram showing one example of the partial product bit generating circuit 14 in the prior art multiplier circuit; this example is disclosed in the above Japanese Unexamined Patent Publication No. 55-105732. Table 1 below is a truth table for explaining the second-order Booth encoding method.

TABLE 1

| bj − 1 | bj | bj + 1 | Xj | 2Xj | Mj | PLj |
|---|---|---|---|---|---|---|
| 0 | 0 | 0 | 0 | 0 | 0 | 0 |
| 0 | 0 | 1 | 0 | 1 | 1 | 0 |
| 0 | 1 | 0 | 1 | 0 | 0 | 1 |
| 0 | 1 | 1 | 1 | 0 | 1 | 0 |
| 1 | 0 | 0 | 1 | 0 | 0 | 1 |
| 1 | 0 | 1 | 1 | 0 | 1 | 0 |
| 1 | 1 | 0 | 0 | 1 | 0 | 1 |
| 1 | 1 | 1 | 0 | 0 | 0 | 0 |

Here, ai is the i-th digit of an m-bit multiplicand (the 0th digit is the least significant digit, and the (m−1)th digit is the most significant digit indicating the sign, as in 2's (twos) complement notation), and bj is the j-th digit of an n-bit multiplier represented in the same notation as the multiplicand. Further, Xj, 2Xj, and Mj are a set of second-order Booth encoder output signals for the j-th digit of the multiplier, and indicate that one times the multiplicand, two times the multiplicand, and the complement of the multiplicand, respectively, are output as the partial product bit signals for that digit place. As shown in Table 1, from the values (levels) of the bj−1, bj, and bj+1 of the multiplier, Xj, 2Xj, and Mj (PLj) of the corresponding levels are generated by the encoding operation in the Booth encoder 12.

The partial product bit generating circuit 14 shown in FIG. 2 generates a partial product bit signal Pi,j for the i-th digit of the multiplicand and the j-th digit of the multiplier from the three signals (Xj, 2Xj, and Mj) and the multiplicand bits (ai and ai−1). With the partial product bit generating circuit 14 of FIG. 2, since a set of encoder-output signals is generated for two multiplier bits as the result of Booth encoding, the number of summand bits in each digit column is reduced by half compared with direct summation; this achieves a faster operating speed and a reduction in the number of circuit elements required.

As shown in FIG. 2, this partial product bit generating circuit consists of two AND circuits 101 and 102, a NOR circuit 103, and an ENOR circuit 104, and requires 18 transistors (elements) when the circuit is implemented using CMOS (complementary metal-oxide semiconductor) technology most commonly used for the fabrication of large-scale semiconductor integrated circuits.

FIG. 3 is a circuit diagram showing another example of the partial product bit generating circuit 14 in the prior art multiplier circuit; this example is disclosed in Japanese Unexamined Patent Publication No. 4-227534.

In the case of the partial product bit generating circuit 14 shown in FIG. 3, the Booth encoder 12 outputs five sets of signals, SX2 (for +2), SX2* (for −2), SX1 (for +1), SX1* (for −1), and S0 (for 0), and either one of the multiplicand bit signal, ai, ai−1, /ai, or /ai−1, or a signal fixed to a 1 (high level "H") is selected and is output via an inverter. The partial product bit generating circuit of FIG. 3 consists of a transistor (P-channel MOS transistor) 105, four transfer gates 106 to 109, and five inverters 110 to 114; the number of necessary elements shown in the figure is 19.

Furthermore, in the partial product bit generating circuit of FIG. 3, signal lines for ai and ai−1 (multiplicand bit signals) are connected directly to the input terminals of the corresponding transfer gates; in this case, however, unless the driving capability of the gates that output ai and ai−1 is sufficiently large, the time constant of the series resistance of the transfer and drive gates and the capacitance determined by the sum of the gate capacitance of each inverter within the circuit, the capacitance of the line connected to each input terminal, and the source-drain capacitance of each transfer gate, becomes very long, leading to an increase in power consumption because of signal waveform degradation and an increase in delay time because of longer signal rise and fall times.

Accordingly, the same ai signal line can be connected, at most, to two partial product bit generating circuits; if the signal is to be supplied to three or more generating circuits, a separate buffer circuit will become necessary. Furthermore, since inverters are needed for inverting ai and ai−1, and these additional circuits require 4 elements per bit, a total of 23 elements (23 transistors) are required. If an inverted signal of each of the SX2, SX2*, SX1, and SX1* signals is prepared in advance and is input to the partial product bit generating circuit, the inverters for controlling the transfer gates become unnecessary and the number of elements required can be reduced to 15. In that case, however, the number of signal lines as a set increases to 9, which is not desirable since this poses a connection problem in LSI implementation.

Figure 4:
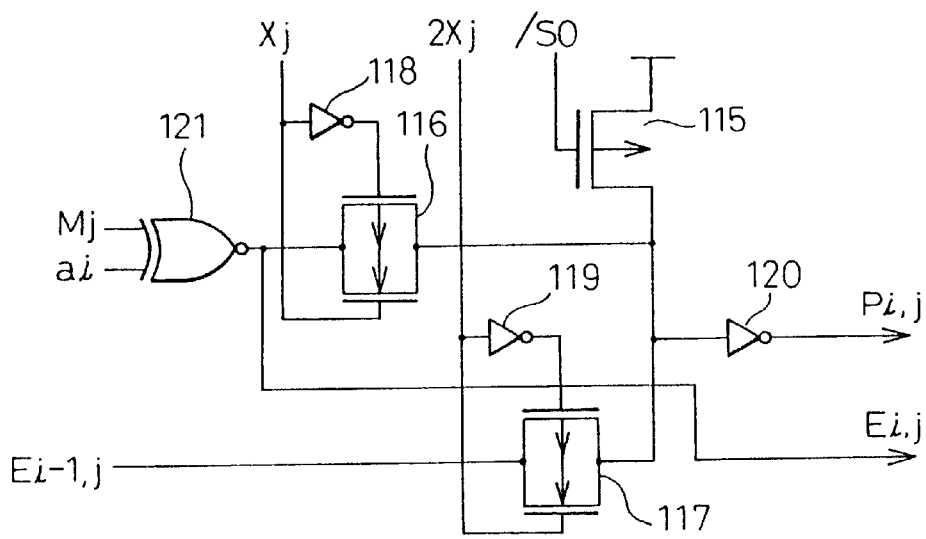
FIG. 4 is a circuit diagram showing still another example of the partial product bit generating circuit in the prior art multiplier circuit.

FIG. 4 is a circuit diagram showing still another example of the partial product bit generating circuit 14 in the prior art multiplier circuit; this example is disclosed in Japanese Unexamined Patent Publication No. 5-88852. The partial product bit generating circuit 14 shown in FIG. 4 consists of a transistor 115, two transfer gates 116 and 117, three inverters 118 to 120, and an ENOR circuit 121, and requires a total of 21 elements.

Next, the prior art configuration of the Wallace tree circuit 15 will be described. In the Wallace tree circuit 15, the partial product bits for each digit place (totalling (n/2+1) bits at maximum), generated via the Booth encoder 12, are repeatedly compressed using a carry-save adder circuit until the number of bits for each digit place finally becomes 2. As the carry-save adder circuit used here, a 1-bit full-adder circuit or a 4-2 compression circuit is employed. When the number of bits in each digit place is large, the latter circuit can often perform processing at higher speed.

Figure 5:
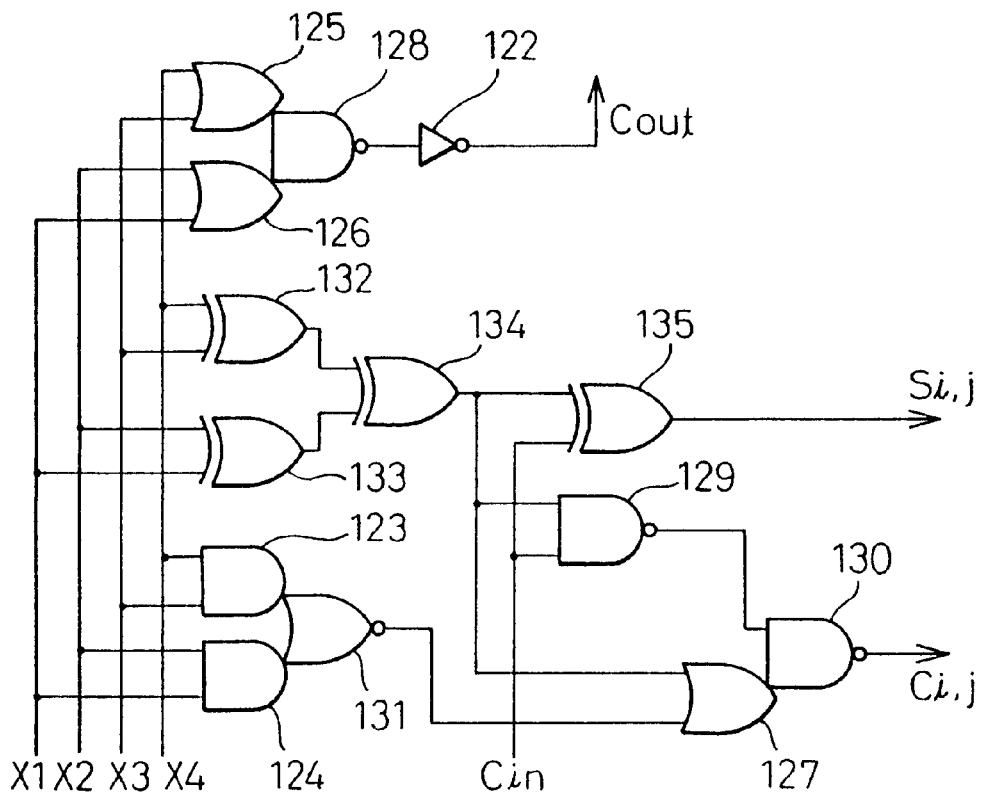
FIG. 5 is a circuit diagram showing an example of a 4-2 compression circuit constituting a Wallace tree circuit in the prior art multiplier circuit.

FIG. 5 is a circuit diagram showing one example of the 4-2 compression circuit constituting the Wallace tree circuit 15 in the prior art multiplier circuit; this example is disclosed in Japanese Unexamined Patent Publication No. 2-112020. The 4-2 compression circuit shown in FIG. 5 consists of an inverter 122, two AND circuits 123 and 124, three OR circuits 125 to 127, three NAND circuits 128 to 130, one NOR circuit, and four EOR circuits 132 to 135. That is, the 4-2 compression circuit exemplified by the configuration shown in FIG. 5 requires the use of four EOR circuits 132 to 135 for exclusive-ORing (EORing) five inputs, including an intermediate carry-in signal Cin, in order to generate a sum signal Si,j which is one of output signals.

Figure 6:
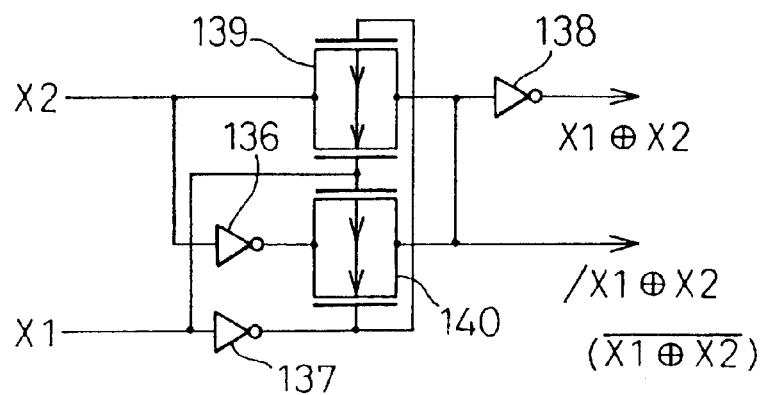
FIG. 6 is a circuit diagram showing a 10-transistor EOR circuit used in a conventional implementation.

FIG. 6 is a circuit diagram showing a 10-transistor EOR circuit (complementary transfer gate EOR circuit) in a conventional implementation, which is used to generate an exclusive-OR signal (EOR signal) of two input signals x1 and x2. Further, FIG. 7 is a circuit diagram showing a sum signal generating circuit of a full-adder circuit constructed from 6-transistor EOR circuits (single-transfer-gate EOR circuits) EOR1 and EOR2, used in a conventional implementation, to generate an EOR signal of three input signals x1, x2, and x3.

As shown in FIG. 6, using CMOS circuit technology commonly employed for the fabrication of LSI circuits, the complementary transfer gate EOR circuit usually requires 10 transistors for three inverters 136, to 138 and two transfer gates 139 and 140.

Figure 7:
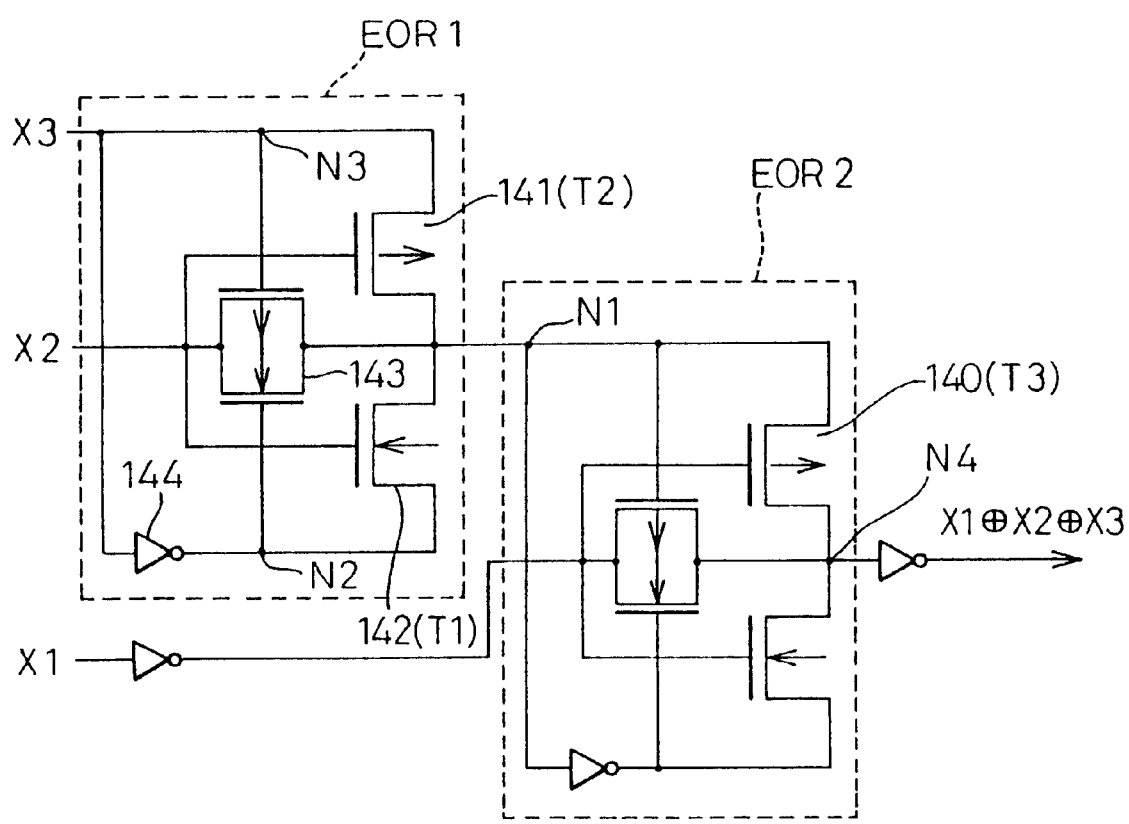
FIG. 7 is a circuit diagram showing a sum signal generating circuit of a full-adder circuit constructed from two 6-transistor EOR circuits used in a conventional implementation.

Likewise, as shown in FIG. 7, one EOR circuit (EOR1) can be constructed using transistors 141 and 142, a transfer gate 143, and an inverter 144. That is, the EOR circuit can be constructed with six transistors (elements). This 6-transistor single-transfer-gate EOR circuit constructed with six transistors is cited in many documents, for example, Japanese Unexamined Patent Publication Nos. 58-211252, 59-211138, 61-262928, and 4-227534.

However, the processing speed of the above 6-transistor EOR circuit is much slower than that of the 10-transistor EOR circuit shown in FIG. 6, and in particular, when two EOR circuits are directly coupled together, as shown in FIG. 7, the processing speed becomes intolerably slow. The reason is as follows.

In FIG. 7, suppose that now X1="1", X2="1", and X3="1" and at the next time instant these input conditions change to X1="0", X2="0", and X3="1". This causes the N-channel transistor 142 (T1) to change from the ON to the OFF state and the P-channel transistors 141 (T2) and 140 (T3) from the OFF to the ON state. As a result, current which was flowing via node N2 now flows via node N3, but since the nodes N2 and N3 are electrically isolated (shut off) from each other, the change at the node N2 does not affect the node 3, nor does the change at the node N3 affect the node 2. Furthermore, the potential at node N1 changes only slowly because it does not change until the current begins to flow through the series circuit of the high-resistance P-channel transistors T2 and T3.

On the other hand, the switch circuit (transfer gates 139 and 140) shown in FIG. 6 is constructed with P-channel and N-channel transistors connected in parallel, so that when one transistor is turned off, the other transistor is turned on, the state changes of both transistors affecting each other to accelerate the change, thus achieving high-speed switching. As described above, the 6-transistor EOR circuit uses fewer elements but sacrifices the operating speed, and is therefore not suitable for circuit applications requiring high operating speed. On the other hand, if the Wallace tree circuit shown in FIG. 5 is constructed using the 10-transistor EOR circuits, a total of 66 elements (66 transistors) will be required.

FIGS. 8A to 8C and FIGS. 9A to 9C are diagrams for explaining how the delay of operation is caused when a transfer gate is used.

Figure 8A:
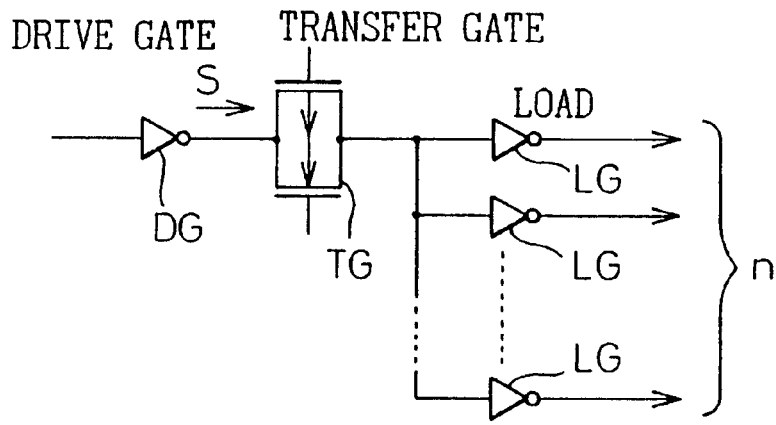
FIGS. 8A to 8C are diagrams (part 1) for explaining the delay of operation caused when a transfer gate is used.
Figure 8B:
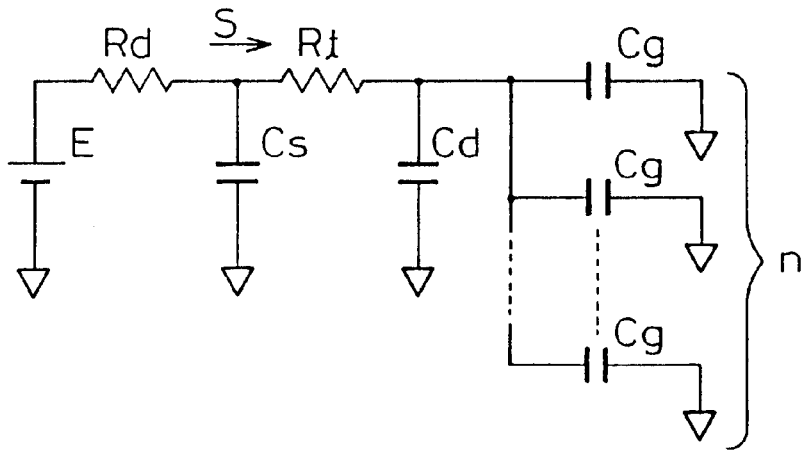

First, consider the case shown in FIG. 8A where signal S from the drive gate DG is supplied to the transfer gate TG and a plurality of loads LG (for example, n inverters) are driven by the output of the transfer gate TG. Then the equivalent circuit will be as shown in FIG. 8B. As shown, the equivalent circuit is represented by the voltage source E and resistance Rd of the drive gate DG, the resistance (ON resistance) of the transfer gate TG, the capacitances Cs and Cd of the source and drain of the transistor constituting the transfer gate TG, and the input capacitances Cg of the n loads LG.

Figure 8C:
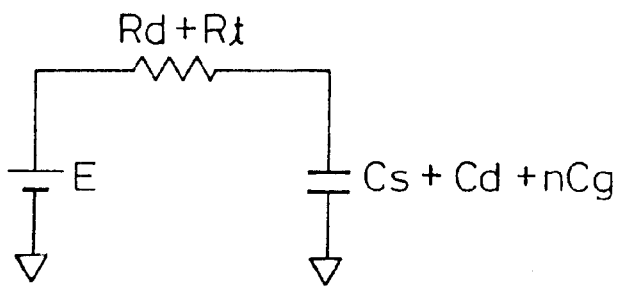

To simplify the explanation, if the equivalent circuit of FIG. 8B is rewritten as shown in FIG. 8C, delay time $\tau 1$ in the rising and falling of the signal S is given by $$\tau 1 \propto (Rd+Rt) \cdot (Cs+Cd+nCg) \approx 3/2 \cdot (n+2) \cdot Cg \cdot Rd$$

Here, it is assumed that $Rt \approx 1/2 \cdot Rd$ and $Cs \approx Cd \approx Cg$. In the case of a miniaturized semiconductor device, for example, a CMOS device with a line width of about 0.35 $\mu$m, $Cs \approx Cd \approx Cg$ substantially holds.

In this way, when driving the loads LG by the transfer gate TG, the transfer gate TG must drive each load LG with its input capacitance multiplied by 1.5 as shown above, as a result of which the delay time $\tau 1$ increases (driving speed decreases). Furthermore, considering the effects of +2 in the term (n+2) in the above equation, the increase in the delay time $\tau 1$ becomes larger than when the delay time is simply proportional to the number n.

Figure 9A:
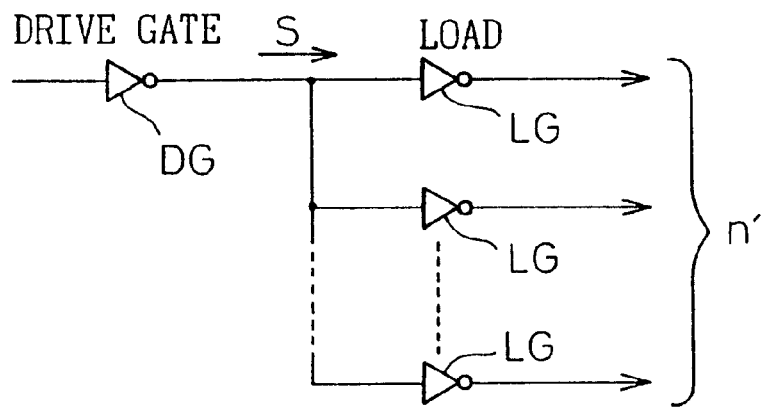
FIGS. 9A to 9C are diagrams (part 2) for explaining the delay of operation caused when a transfer gate is used.
Figure 9B:
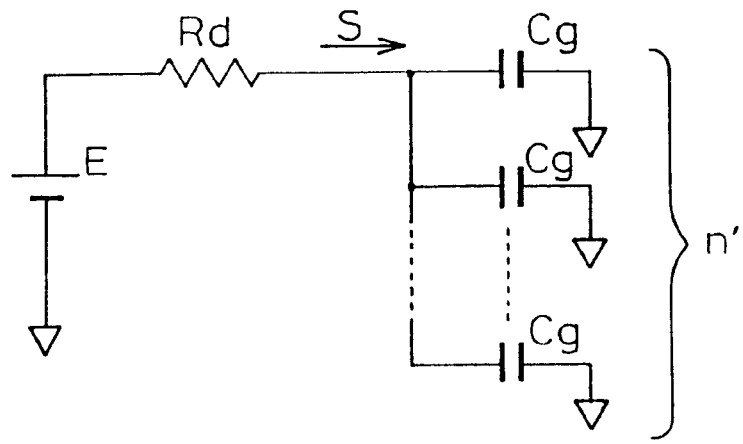
Figure 9C:
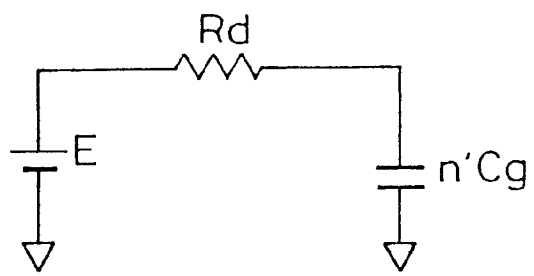

On the other hand, in the case shown in FIG. 9A where the signal S from the drive gate DG is supplied directly to drive a plurality of loads LG (for example, n' inverters), the equivalent circuit will be as shown in FIG. 9B. The equivalent circuit of FIG. 9B can be further simplified as shown in FIG. 9C. Here, delay time $\tau 2$ in the rising and falling of the signal S is given by $$\tau 2 \propto n' \cdot Rd \cdot Cg$$

When driving the n' loads LG by the drive gate DG shown in FIGS. 9A to 9C, the drive gate DG need only drive the input capacitance Cg of each load LG multiplied by the number n', achieving a higher driving speed than when the n loads LG are driven by the transfer gate TG shown in FIGS. 8A to 8C.

Figure 10:
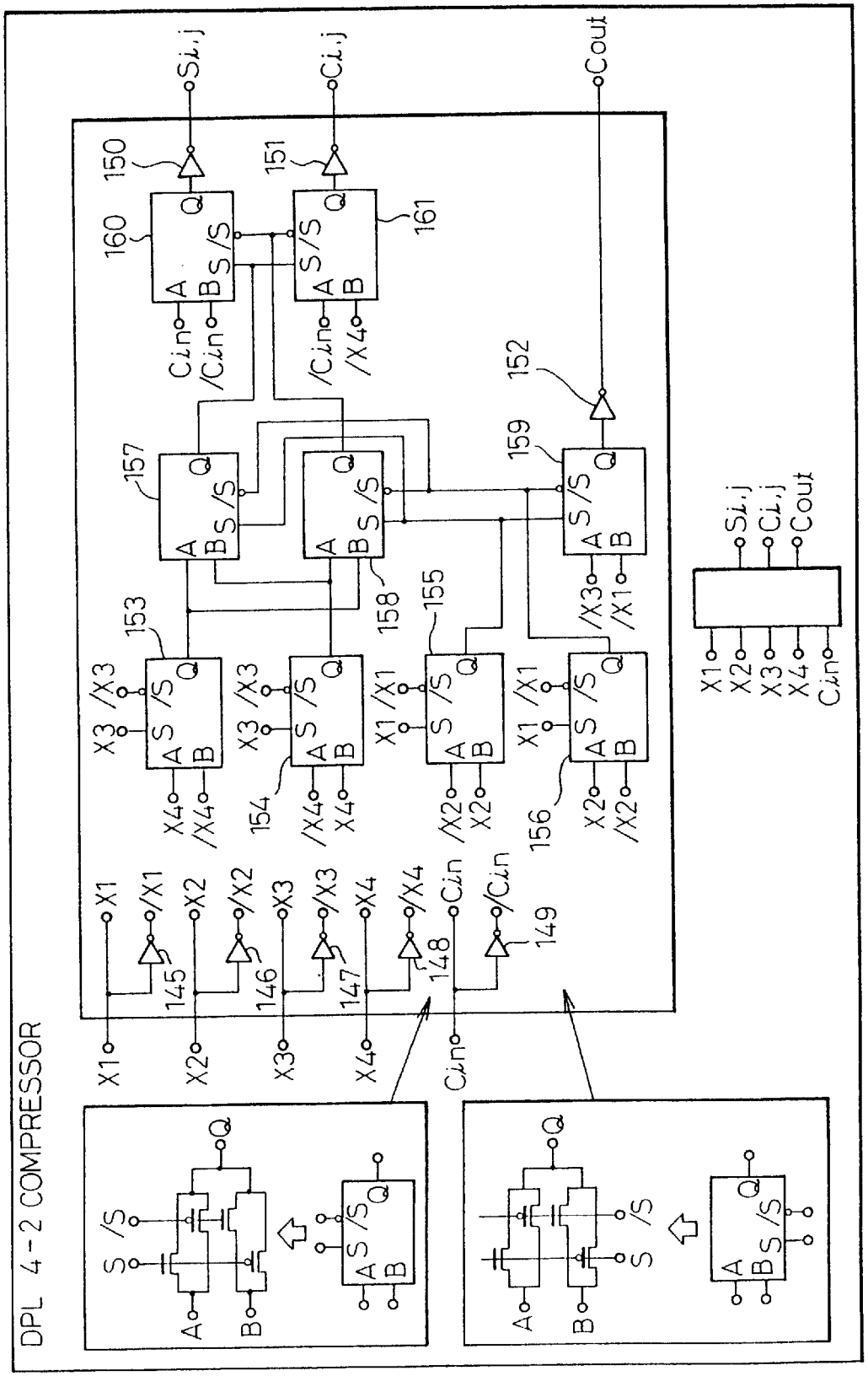
FIG. 10 is a circuit diagram showing another example of the 4-2 compression circuit constituting the Wallace tree circuit in the prior art multiplier circuit.

FIG. 10 is a circuit diagram showing another example of the 4-2 compression circuit constituting the Wallace tree circuit in the prior art multiplier circuit; this example shows the configuration of the 4-2 compression circuit described in the paper (pp. 251–257) carried in the March 1995 issue of "IEEE Journal of Solid-State Circuits", a magazine issued by The Institute of Electrical and Electronics Engineers, Inc. (IEEE), U.S.A. As shown in FIG. 10, the 4-2 compression circuit (Dual Pass Transistor Logic (DPL) 4-2 Compressor) consists of eight inverters 145 to 152 and nine complementary transfer gates 153 to 161, using a total of 52 elements (52 transistors). However, in the 4-2 compression circuit of FIG. 10 also, since the series resistance of transfer gates is directly connected to each signal input terminal, if the input capacitance is large, for example, when a long connecting line is connected to the input terminal, or if there exists an additional input resistance, the signal rise and fall times increase and the processing speed decreases.

In the Wallace tree circuit, if the number of bits to be compressed for each digit place can be reduced, the number of compression circuits required can be reduced, as a result of which the size of the multiplier circuit can be reduced. In the prior art, the reduction of the number of bits for each digit place has been addressed primarily from the standpoint of compressing the sign bits of partial products. Specific examples are disclosed, for example, in Japanese Unexamined Patent Publication Nos. 57-121736 and 59-3634.

Further, Japanese Unexamined Patent Publication No. 4-287220 discloses a correction means which enables the correct calculation result to be obtained without extending the sign of each partial product to a higher digit place when adding together partial products (multiples) in 2's complement representation, and carries a description of a multiplier circuit in which adders for adding sets of partial products are modified so that, without requiring an independent correction circuit for performing operations on the signs of the partial products and adding correction values, calculation results comparable to the correction circuit can be obtained using the correction means. However, with the method disclosed in Japanese Unexamined Patent Publication No. 4-287220, though the circuitry relating to the sign digit can be simplified, the critical path in the Wallace tree circuit cannot be shortened because the maximum number (n/2+1) of partial product bits for each digit place cannot be changed when using the second-order Booth algorithm.

Further, in General Lecture C-541 (A Collection of Lecture Papers, Electronics 2, p. 157), 1996 General Convention of The Institute of Electronics, Information and Communication Engineers, a method is proposed in which 2's complement is obtained in advance for the low-order 5 bits of the multiplicand, and when the result of Booth encoding is negative, the 2's complement bits thus obtained are output instead of the usual partial product bits, thereby reducing the maximum number of partial product bits for each digit place to n/2 bits and thus achieving faster operation. While this method can reduce the maximum number of partial product bits for each digit place and thereby shorten the critical path in the Wallace tree circuit, a delay longer than the delay introduced by the Booth encoder occurs when generating the complement of 5 bits, and further, a circuit for generating the complement of 5 bits is required; therefore, the effect of increasing the speed by reducing the maximum number of partial products is offset by these disadvantages, and rather, the number of elements in the multiplier circuit as a whole may increase in some cases.

Referring again to the encoder and the partial product bit generating circuit, the prior art partial product bit generating circuit 14 requires about 20 elements per bit, and while the number of bits to be added together for each digit place is reduced by half by Booth encoding, the reduction in the total number of circuit elements is not as large as expected since a large number of elements are required for generation of the partial product bits. In particular, when the number, n, of multiplier bits is small, the total number of elements may increase.

As described, in the prior art, various efforts have been made to increase the speed of the multiplier circuit and reduce the number of necessary elements, but there still is room for improvements to achieve a faster multiplier circuit with a smaller number of elements. The present invention is intended to improve the individual circuits constituting the multiplier circuit and to provide an excellent multiplier circuit compared with the prior art by combining the improved circuits.

A multiplier circuit according to the invention, an adder circuit constituting part of the multiplier circuit, a partial product bit compression method for the multiplier circuit, and a large-scale semiconductor integrated circuit using the multiplier circuit will be described below with reference to the accompanying drawings illustrating the embodiments thereof.

First, a partial product bit generating circuit (multiplier circuit) employing a configuration that can reduce the number of necessary elements by half, according to a first embodiment of the invention, and an embodiment of an encoder (Booth encoder) suitable for implementing the partial product bit generating circuit will be described.

Figure 11:
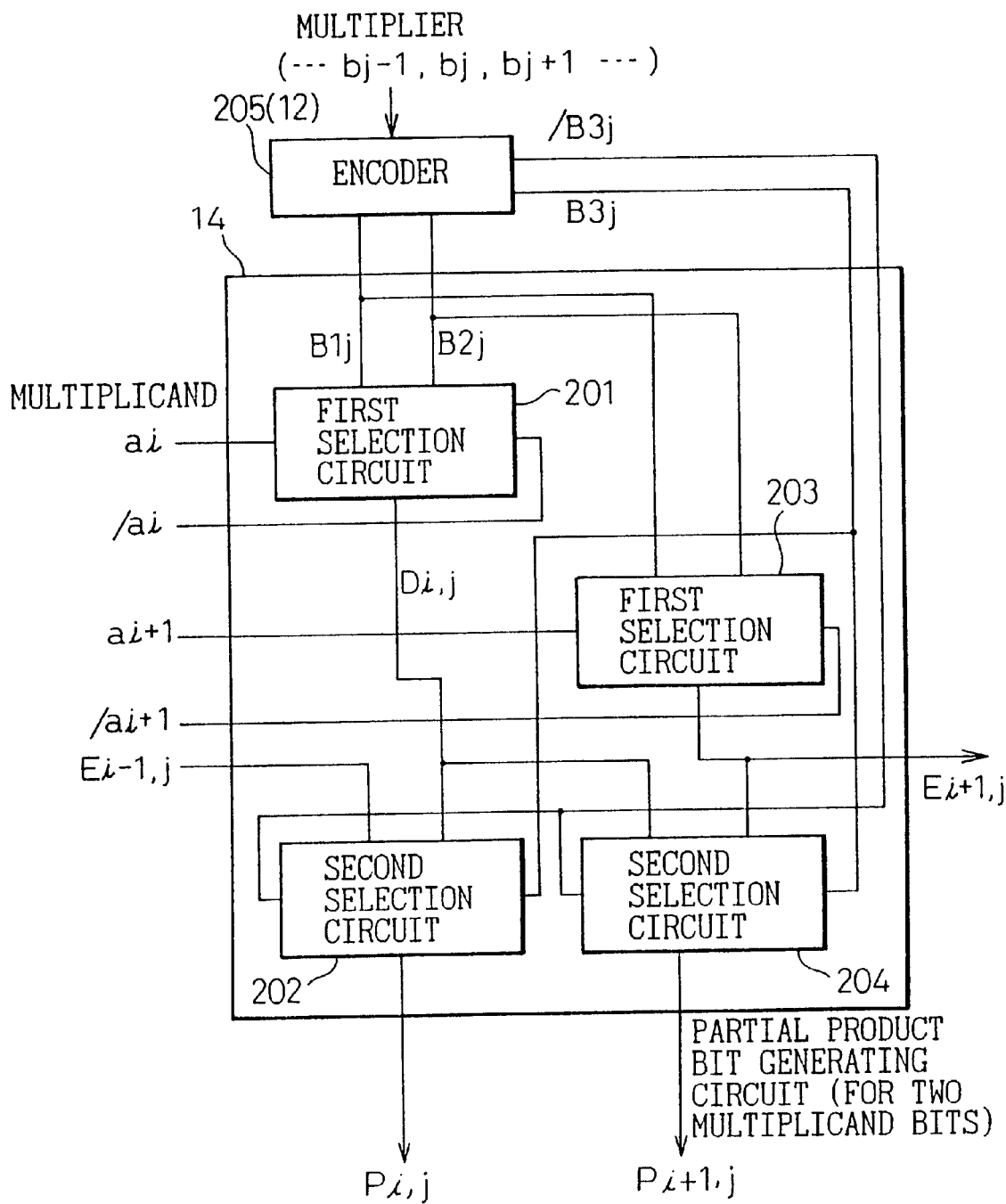
FIG. 11 is a block diagram showing the basic configuration of a partial product bit generating circuit in a multiplier circuit according to the present invention.

FIG. 11 is a block diagram showing the basic configuration of the partial product bit generating circuit 14 in the multiplier circuit according to the present invention. In the figure, reference numeral 201 is a first selection circuit for a multiplicand bit ai in the i-th digit place; 202 is a second selection circuit for the multiplicand bit ai; 203 is a first selection circuit for a multiplicand bit ai+1 in the (i+1)th digit place; and 204 is a second selection circuit for the multiplicand bit ai+1. Further, reference numeral 205 indicates an encoder which generates encode signals B1$j$, B2$j$, B3$j$, and /B3$j$ by using a multiplier bit bj in the j-th digit place and the multiplier bits in its next higher and lower digit places.

The first selection circuit 201 for the multiplicand bit ai in the i-th digit place outputs the encode signal B1$j$ when the multiplicand bit ai is a 1, and outputs the encode signal B2$j$ when the multiplicand bit ai is a 0. The other selection circuits 202 to 204 have similar functions.

Now, suppose that the encoder (12) is a second-order Booth encoder, and that B1$j$=PL$j$ (the result of encoding is positive), B2$j$=M$j$ (the result of encoding is negative), B3$j$=X$j$ (the result of encoding is one times the multiplicand), and /B3$j$=/X$j$, as shown in the previously described Table 1 as a truth table. Then, the second selection circuit 202 for the multiplicand bit ai in the i-th digit place outputs a partial product bit Pi,j for the multiplicand bit ai and the multiplier bit bj, while the second selection circuit 204 for the multiplicand bit ai+1 in the (i+1)th digit place outputs a partial product bit Pi+1,j for the multiplicand bit ai+1 and the multiplier bit bj.

That is, the partial product bit generating circuit of FIG. 11 generates partial product bits for two successive bits (ai, ai+1) of the multiplicand. Here, reference sign Ei−1,j indicates the signal selected and output from a first selection circuit (203) for a multiplicand bit ai−1 in the next lower digit place. The signal Ei+1,j selected and output from the circuit of FIG. 11 is therefore used to generate a partial product bit Pi+2,j for the next higher digit place. As will be described later, according to the first embodiment of the invention, the circuit configuration shown in FIG. 11 allows the selection circuits (201 to 204) to be constructed using fewer elements than EOR circuits, as a result of which partial product bits can be generated using fewer elements than the prior art and without reducing the processing speed.

Figure 12:
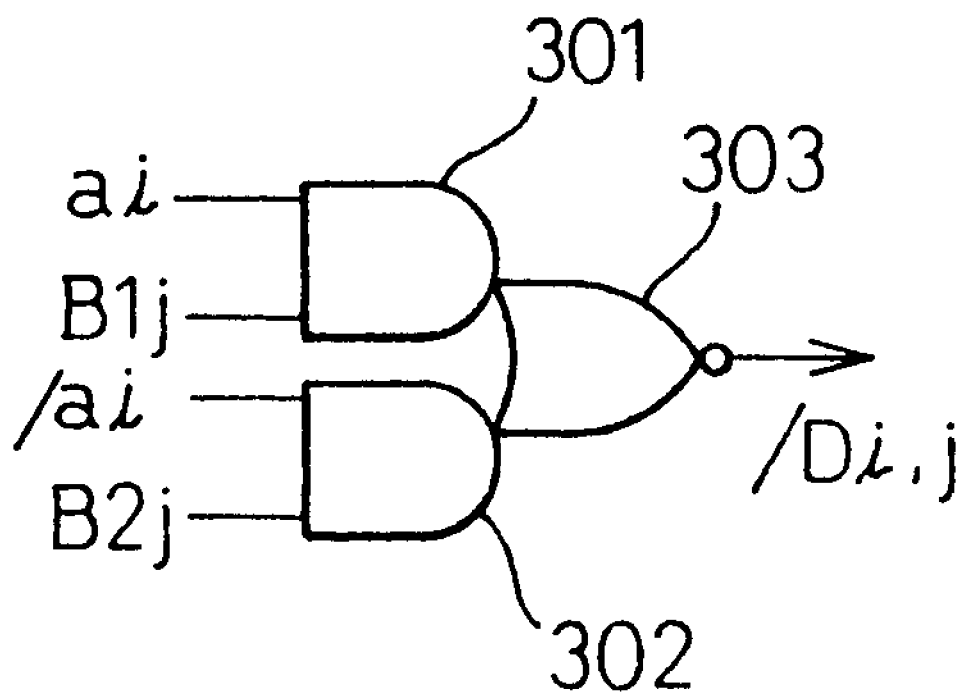
FIG. 12 is a circuit diagram showing an example of a selection circuit used in the partial product bit generating circuit in the multiplier circuit of the present invention.

FIG. 12 is a circuit diagram showing one example of the configuration for the selection circuits (201 to 204) used in the partial product bit generating circuit in the multiplier circuit of the present invention.

As shown in FIG. 12, the selection circuit configuration (for the first selection circuits 201, 203 and the second selection circuits 202, 204) consists of two AND circuits 301, 302 and a NOR circuit 303. Here, the signal output from the first selection circuit 201, 203 is inverted with respect to the selected signal, but this inverted signal is again inverted by the subsequent second selection circuit 202, 204 whose output is therefore the non-inverted signal of the selected signal. In the present embodiment, the partial product bit generating circuit (for two bits) requires 8×4=32 elements (transistors), that is, 16 elements per bit. It is thus shown that the partial product bit generating circuit (with 16 elements per bit) of the present embodiment can be constructed with fewer elements than any of the partial product bit generating circuits (14) of the prior art shown in FIGS. 2 (18 elements per bit), 3 (19 elements per bit), and 4 (21 elements per bit).

Figure 13:
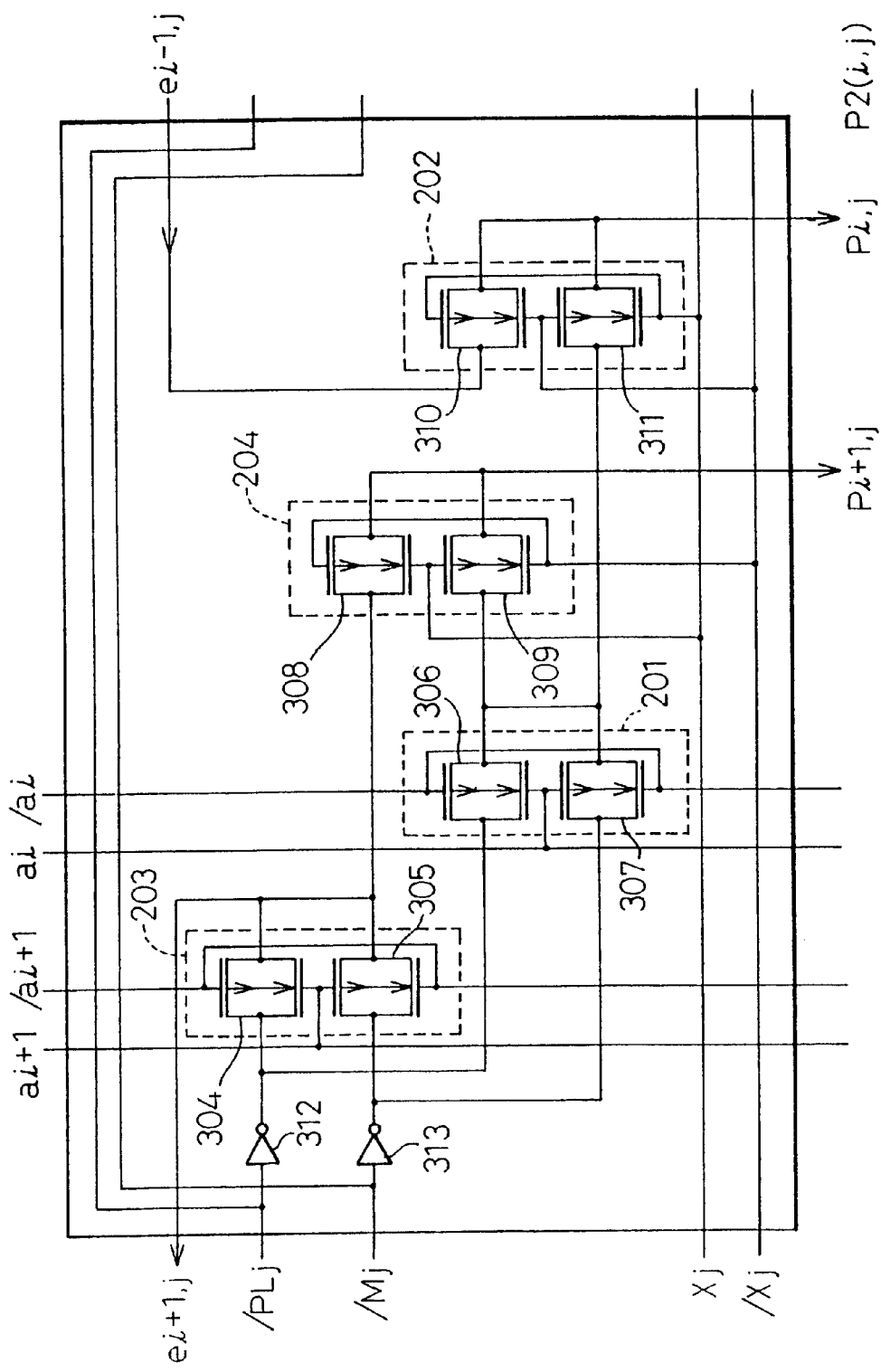
FIG. 13 is a circuit diagram showing another embodiment of the partial product bit generating circuit in the multiplier circuit of the present invention.

FIG. 13 is a circuit diagram showing another embodiment of the partial product bit generating circuit 14 in the multiplier circuit of the present invention. This embodiment is constructed to further reduce the number of elements compared with the partial product bit generating circuit constructed with the selection circuits shown in FIG. 12.

As shown in FIG. 13, the partial product bit generating circuit (for two bits) of this embodiment is constructed with eight transfer gates 304 to 311 and two inverters 312 and 313. In comparison with the partial product bit generating circuit 14 of FIG. 11, the first selection circuit 201 and second selection circuit 202 for the multiplicand bit ai in the i-th digit place are constructed from the transfer gates 306, 307 and transfer gates 310, 311, respectively, while the first selection circuit 203 and second selection circuit 204 for the multiplicand bit ai+1 in the (i+1)th digit place are constructed from the transfer gates 304, 305 and transfer gates 308, 309, respectively.

The output signal Pi+1,j from the second selection circuit 204 for the multiplicand bit ai+1 and the output signal Pi,j from the second selection circuit 202 for the multiplicand bit ai can be written by logic expressions as shown below, from which it can be seen that two successive partial product bits are generated.

$$Pi+1,j=(PLj·ai+1+Mj·/ai+1)·Xj+(PLj·ai+Mj·/ai)·/Xj$$

$$Pi,j=(PLj·ai+Mj·/ai)·Xj+(PLj·ai-1+Mj·/ai-1)·/Xj$$

In the partial product bit generating circuit (for two bits) shown in FIG. 13, the number of elements required is 20, which means 10 elements (10 transistors) per bit, achieving a reduction by a factor of about 2 compared with the prior art partial product bit generating circuits (18 to 21 elements per bit) shown in FIGS. 2 to 4.

Here, the inverters 312 and 313, to which Booth encode signals /PLj (complement of the signal output when the result of encoding is positive) and /Mj (complement of the signal output when the result of encoding is negative) are respectively input, are provided to avoid the problems that could arise if the encode signals were applied directly to the input terminals of the transfer gates (the problems described in connection with FIG. 3, such as increased power consumption due to signal waveform degradation and increased delay time due to longer signal rise and fall times). These inverters would be unnecessary if the logic gates for outputting the encode signals had sufficient driving capability. If the inverters 312 and 313 are not necessary, the number of elements required to construct the partial product bit generating circuit (for two bits) can be reduced below 20. There are further required inverters for creating the complements of the multiplicand bits ai, ai+1, ai−1, etc., but since the multiplicand bit signals and their complements are applied to tile gate terminals of the transfer gates, inputs to 10 or more partial product bit generating circuits can be supplied from one signal buffer, provided that the driving capability of the signal buffer is sufficiently large, and if the number, n, of bits in the multiplier is 16 or over, for example, the addition of these inverters can be ignored as a factor contributing to increasing the number of elements.

Figure 14:
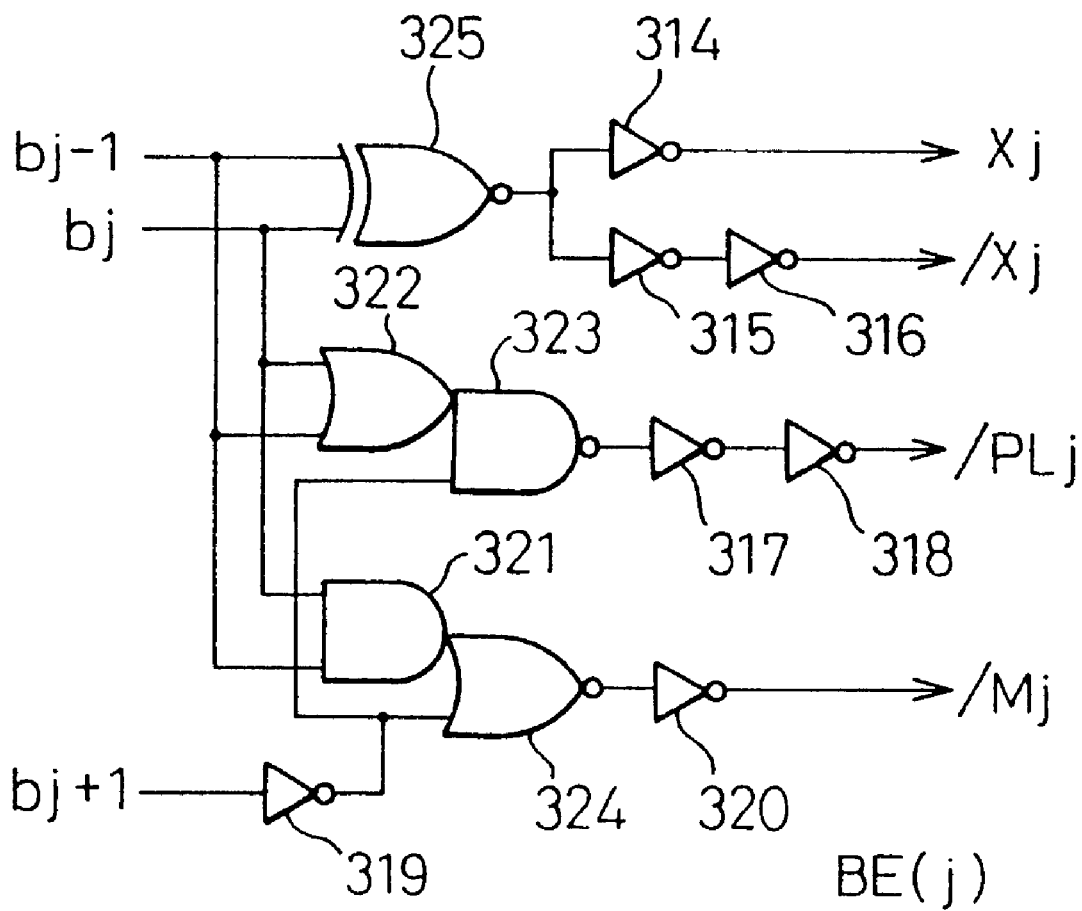
FIG. 14 is a circuit diagram showing an example of a Booth encoder in the multiplier circuit of the present invention.

FIG. 14 is a circuit diagram showing one example of the Booth encoder in the multiplier circuit of the present invention. The figure shows one example of the second-order Booth encode signal generating circuit (encoder) 12 for the circuit shown in FIG. 13. The encode signal symbols shown correspond to the symbols shown in Table 1.

As shown in FIG. 14, the Booth encoder 12 comprises seven inverters 314 to 320, an AND circuit 321, an OR circuit 322, a NAND circuit 323, a NOR circuit 324, and an ENOR circuit 325. Here, some of the inverters located at the output side of the encode signals can be omitted in cases where an encode signal buffer with a low driving capability is acceptable; for example, the pairs of successive inverters (315/316 and 317/318) located in the output paths of the encode signals /Xj and /PLj can be omitted. The number of elements required to construct the Booth encoder 12 may increase somewhat as compared with the prior art, but in the case of a multibit multiplier circuit in which the number, m, of bits in the multiplicand is 16 or more, this increase has little effect because only one encoder is needed for every two multiplier bits.

The above examples have been described assuming the use of a second-order Booth encoder, but similar circuits can also be constructed when using a third- or higher-order Booth encoder; for example, in FIG. 11, this can be accomplished by constructing the second selection circuit as a 4:1 selection circuit, in which case one of four outputs selected in accordance with the values of the multiplicand bits, ai, ai−1, a'i (the i-th digit of three times the multiplicand), and ai−2, is selected for output in corresponding relationship to an encode output that has a positive value out of the encode outputs Xj, 2Xj, 3Xj (three times the multiplicand is selected), and 4Xj (four times the multiplicand is selected). Further, the method of encoding is not necessarily limited to Booth's method, but other encoding methods similar to the one employed in the present embodiment may be applied directly for the circuit of FIG. 11 or by partially modifying the circuit.

Thus, according to the first embodiment of the invention, there are provided a partial product bit generating circuit (multiplier circuit) of the configuration that can reduce the number of necessary elements by half, and an encoder (Booth encoder) suitable for implementing the partial product bit generating circuit.

For a high-speed multiplier circuit suitable for implementation as an integrated (LSI) circuit, a layout method suitable for implementation in integrated circuit form must be considered besides reducing the number of required elements without sacrificing its high speed capability. This subject is briefly described in the present inventor's paper on a multiplier carried in the September 1992 issue of "IEEE Journal of Solid-State Circuits," pp. 1229–1236. However, since the present invention employs a circuit different from the one described in that paper, the layout must be optimized as well. A method for accomplishing this will be described below.

Figure 15:
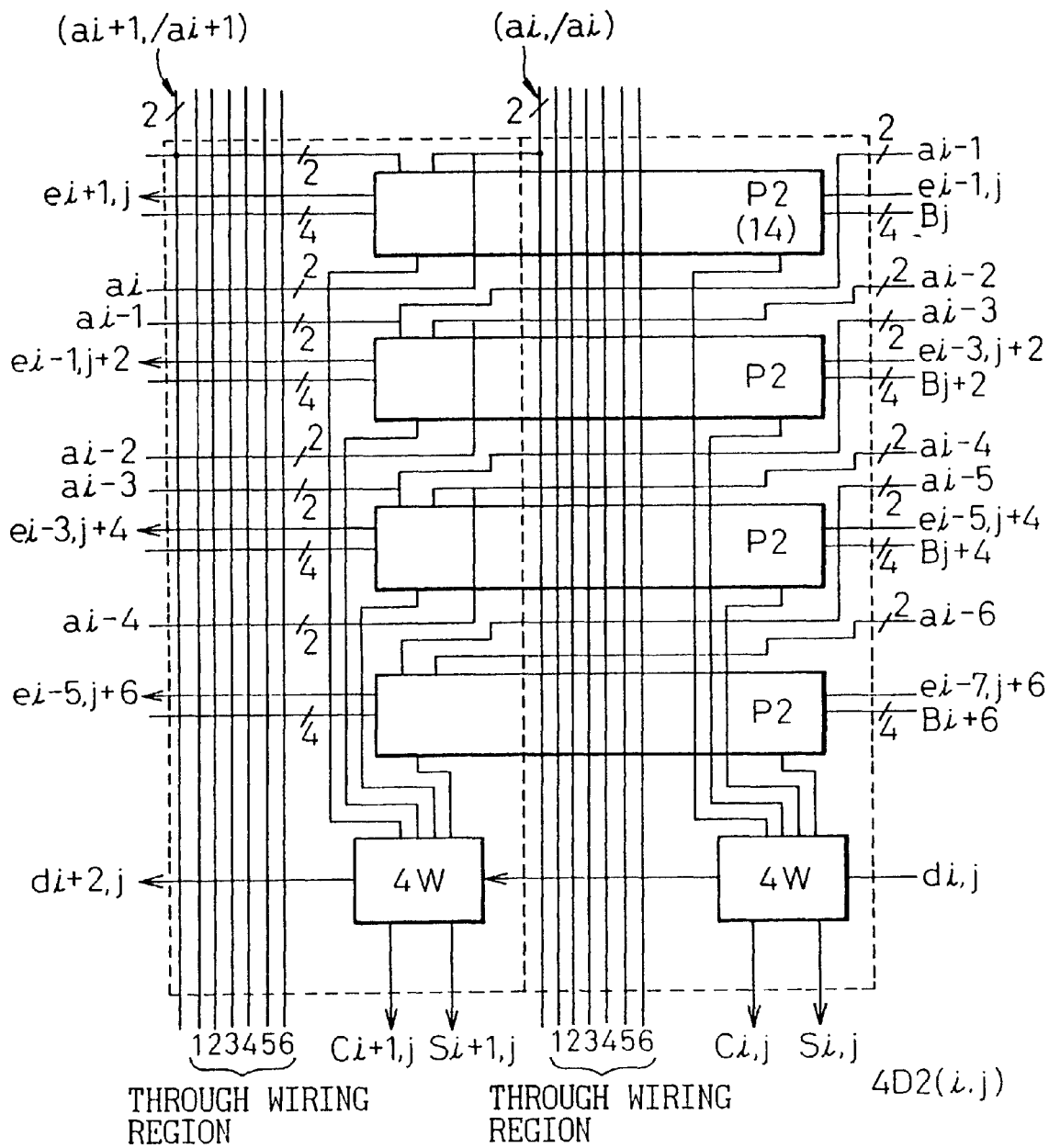
FIG. 15 is a diagram showing a layout of the partial product bit generating circuit in the multiplier circuit of the present invention.

FIG. 15 is a diagram showing the layout of the partial product bit generating circuit in the multiplier circuit of the present invention.

As shown in FIG. 15, multiplicand bit signals (ai, ai+1) corresponding to particular digits in the multiplicand and their inverted signals (/ai, /ai+1) are arranged parallel to each other extending in one direction (vertical direction) in a two-dimensional plane, and sets of encode signal lines (Bj, Bj+2, . . . ) corresponding to particular digits in the multiplier are arranged intersecting them (using horizontally extending wiring patterns on a different layer from the layer on which the multiplicand bit signal lines are formed). In FIG. 15, the complementary multiplicand bit signals ai and /ai, for example, are represented by a single signal line extending vertically on the left side of a through wiring region. Reference sign 4W in FIG. 15 indicates a 4-2 compression circuit which will be described later.

Further, a partial product bit generating circuit (P2:14) is repeated in such a manner as to contain a plurality of predetermined adjacent intersections of the multiplicand bit signal lines and encode signal lines. By repeating the same circuit cell in this way, the partial product generating circuits can be formed one adjacent to another, thus making it easy to lay out the major elements of the multiplier circuit. When a third embodiment of the invention is applied, part of the circuit is replaced by an irregular circuit, but since this affects only part of the partial product bit generating circuit and does not disturb the ordered tree arrangement of the adder circuits, the layout as a whole remains substantially unaffected.

Next, a carry-save adder circuit with four inputs for each digit place (4-2 compression circuit) that can reduce the number of necessary elements will be described in accordance with a second embodiment of the invention.

In a first configuration of the carry-save adder circuit (4-2 compression circuit) which, for each digit place, takes four input signals (x1, x2, x3, x4) and an intermediate carry-in signal (Cin) as inputs and generates an intermediate carry-out signal (Cout), a sum signal (Si,j), and a carry signal (Ci,j) for output, an OR (or NOR) and an exclusive-OR (EOR) of the first input signal x1 and second input signal x2 are formed and, when the exclusive-OR output is true (logic 1), the third input signal x3 is output as the intermediate carry-out signal (Cout), while when the EOR output is false (logic 0), the OR output signal is output as the intermediate carry-out signal (Cout). In a second configuration of the 4-2 compression circuit, an AND (or NAND) and an EOR of the first input signal x1 and second input signal x2 are formed and, when the EOR output is true (logic 1), the third input signal x3 is output as the intermediate carry-out signal, while when the EOR output is false (logic 0), the AND output signal is output as the intermediate carry-out signal.

In each of the first and second configurations, of the circuits that exclusive-OR the five input signals to produce the sum signal, only the circuit that exclusive-ORs the EOR output signal of the first and second input signals with the EOR output signal of the third and fourth input signals is constructed from a 6-transistor circuit (a single-transfer-gate circuit), and all the other EOR circuits are constructed from circuits of eight or more transistors.

In the circuit of the first configuration, the circuit that produces the OR (or NOR) can be used as part of the circuit that exclusive-ORs the first and second inputs for each digit place; likewise, in the circuit of the second configuration, the circuit that produces the AND (or NAND) can be used as part of the circuit that exclusive-ORs the first and second inputs for each digit place. Furthermore, the number of component elements is reduced by selecting the third input signal or the OR/AND signal for output as the intermediate carry-out signal. Moreover, by using the 6-transistor EOR circuit, which is expected to present a problem in terms of speed, only in a section where the speed is least affected, the total number of elements can be reduced without substantially reducing the speed. That is, according to the adder circuit (4-2 compression circuit) of the present invention, the circuit which required more than 50 elements in the prior art can be constructed with 50 or less elements without sacrificing its high speed capability.

Figure 16:
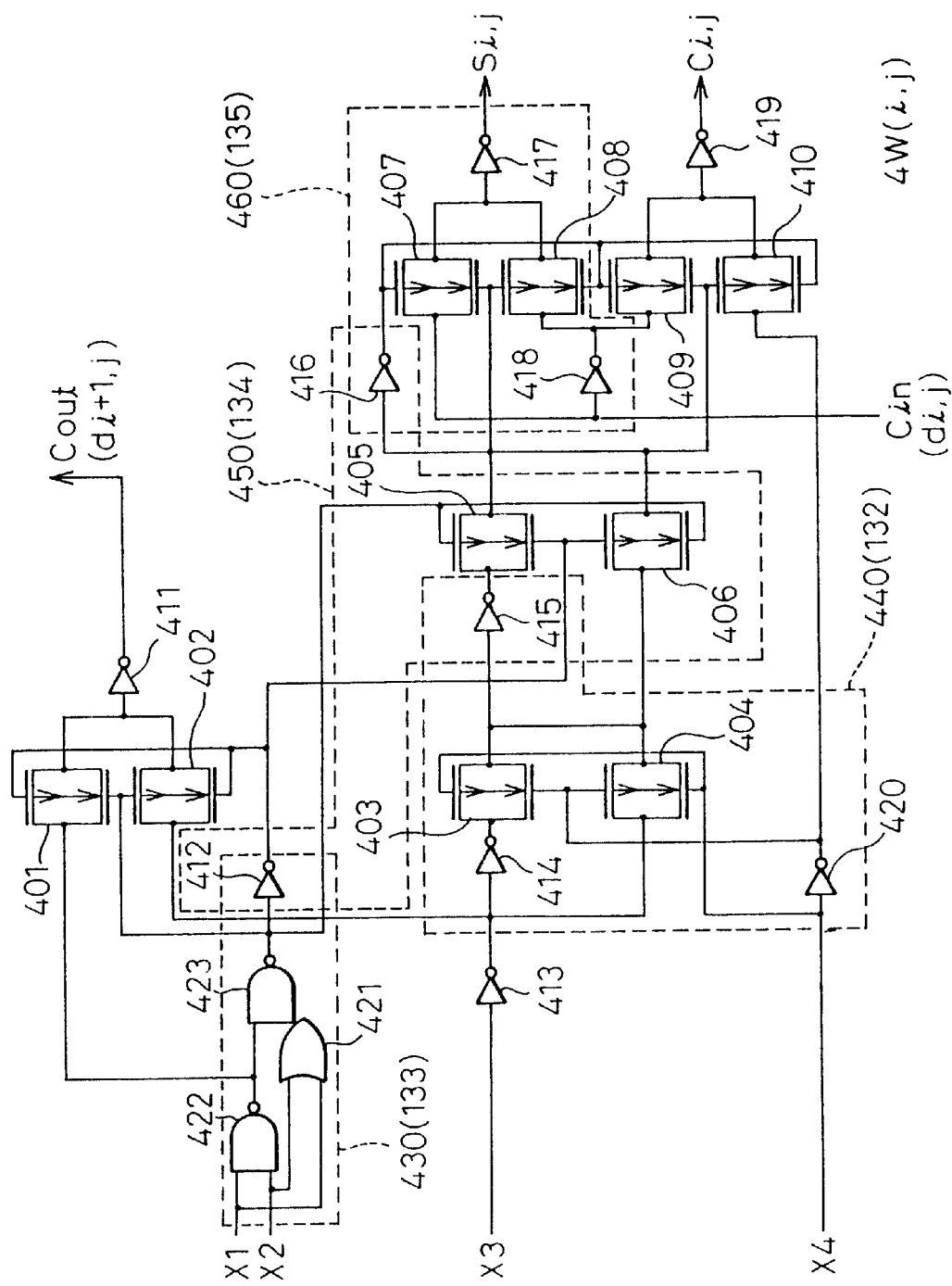
FIG. 16 is a circuit diagram showing an embodiment of a 4-2 compression circuit constituting a Wallace tree circuit in the multiplier circuit of the present invention.

FIG. 16 is a circuit diagram showing one embodiment of the 4-2 compression circuit constituting the Wallace tree circuit in the multiplier circuit of the present invention.

As shown in FIG. 16, the 4-2 compression circuit of this embodiment comprises 10 transfer gates 401 to 410, 10 inverters 411 to 420, an OR circuit 421, and two NAND circuits 422 and 423. Here, an EOR circuit 430 (consisting of an ENOR circuit and an inverter and corresponding to the EOR circuit 133 in FIG. 5) is constructed with the inverter 412, the OR circuit 421, and the NAND circuits 422 and 423; an EOR circuit 440 (corresponding to the EOR circuit 132 in FIG. 5) is constructed with the transfer gates 403 and 404 and the inverters 414, 415, and 420; an EOR circuit 450 (corresponding to the EOR circuit 134 in FIG. 5) is constructed with the transfer gates 405 and 406 and the inverters 412, 415, and 416; and an EOR circuit 460 (corresponding to the EOR circuit 135 in FIG. 5) is constructed with the transfer gates 407 and 408 and the inverters 416, 417, and 418.

As is apparent from FIG. 16, the EOR circuits 440, 450, and 460 are each constructed from the 10-transistor EOR circuit (complementary transfer gate circuit) previously shown in FIG. 6, to maintain the high speed capability of the circuit. Further, the inverter 412 is provided common to the EOR circuits 430 and 450, the inverter 415 common to the EOR circuits 440 and 450, and the inverter 416 common to the EOR circuits 450 and 460, to reduce the number of elements. The EOR circuit 430 is constructed from the ENOR circuit (421, 422, 423) and the inverter 412, using a total of 12 transistors.

In the 4-2 compression circuit shown in FIG. 16, a NAND signal of the first input signal x1 and second input signal x2 and an exclusive-OR signal (EOR signal) of x1 and x2 are produced, and when the EOR output (the output of the inverter 412) is true (logic 1), the third input signal x3 is output as the intermediate carry-out signal (Cout), while when the EOR output is false (logic 0), a NOT signal of the NAND signal (the output of the NAND circuit 422) is output as the intermediate carry-out signal. In the illustrated example, the EOR circuits 440, 450, and 460, excluding the EOR circuit 430 constructed from a drive gate circuit, are each constructed with inverters and transfer gates of 8 to 10 transistors, and the entire circuit is constructed using 50 elements (50 transistors).

Figure 17:
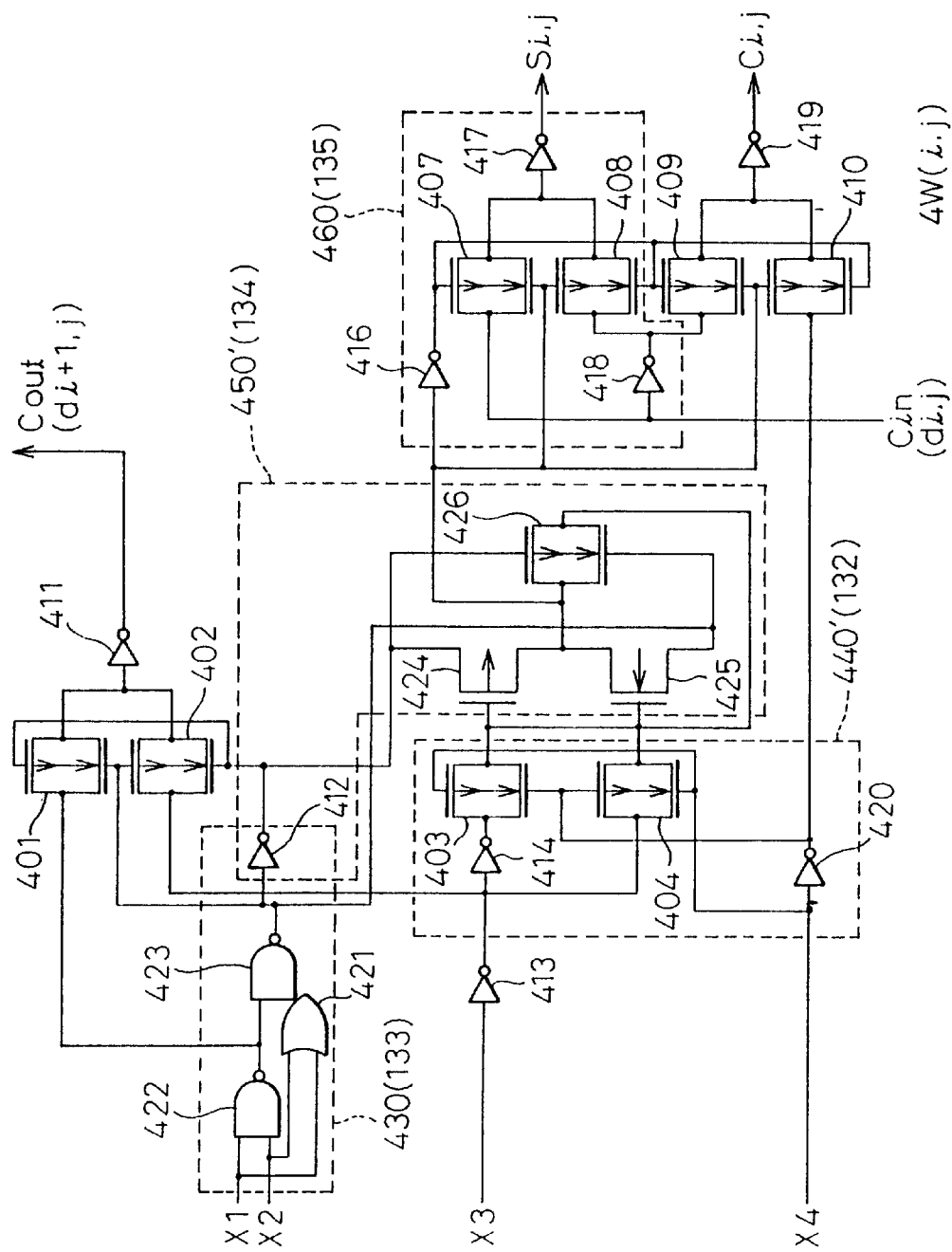
FIG. 17 is a circuit diagram showing another embodiment of the 4-2 compression circuit constituting the Wallace tree circuit in the multiplier circuit of the present invention.

FIG. 17 is a circuit diagram showing another embodiment of the 4-2 compression circuit constituting the Wallace tree circuit in the multiplier circuit of the present invention. The 4-2 compression circuit shown in FIG. 17 achieves a further reduction in the number of elements compared with the 4-2 compression circuit-shown in FIG. 16.

More specifically, in the 4-2 compression circuit of FIG. 17, of the three stages of EOR circuits 440, 450, and 460 in the 4-2 compression circuit of FIG. 16, the EOR circuit (450) located in the intermediate position where the effects of the input and output are least felt is replaced by a 6-transistor EOR circuit 450' which is the same one as that shown in FIG. 7, thereby achieving a further reduction in the number of elements while retaining the high speed capability of the circuit.

As shown in FIG. 17, the circuit (EOR circuit 450') that exclusive-ORs the exclusive OR (EOR signal) of the first input signal x1 and second input signal x2 with the exclusive OR (EOR signal) of the third input signal x3 and fourth input signal x4 is constructed from the 6-transistor EOR circuit. That is, while the EOR circuit 450 in FIG. 16 is constructed with the transfer gates 405 and 406 and the inverters 412, 415, and 416, using a total of 10 transistors, the EOR circuit 450' in FIG. 17 is constructed using six transistors, i.e., transistors 424 and 425, a transfer gate 426, and an inverter 412. As a result, the 4-2 compression circuit shown in FIG. 17 can be constructed using 48 elements (48 transistors).

Figure 18:
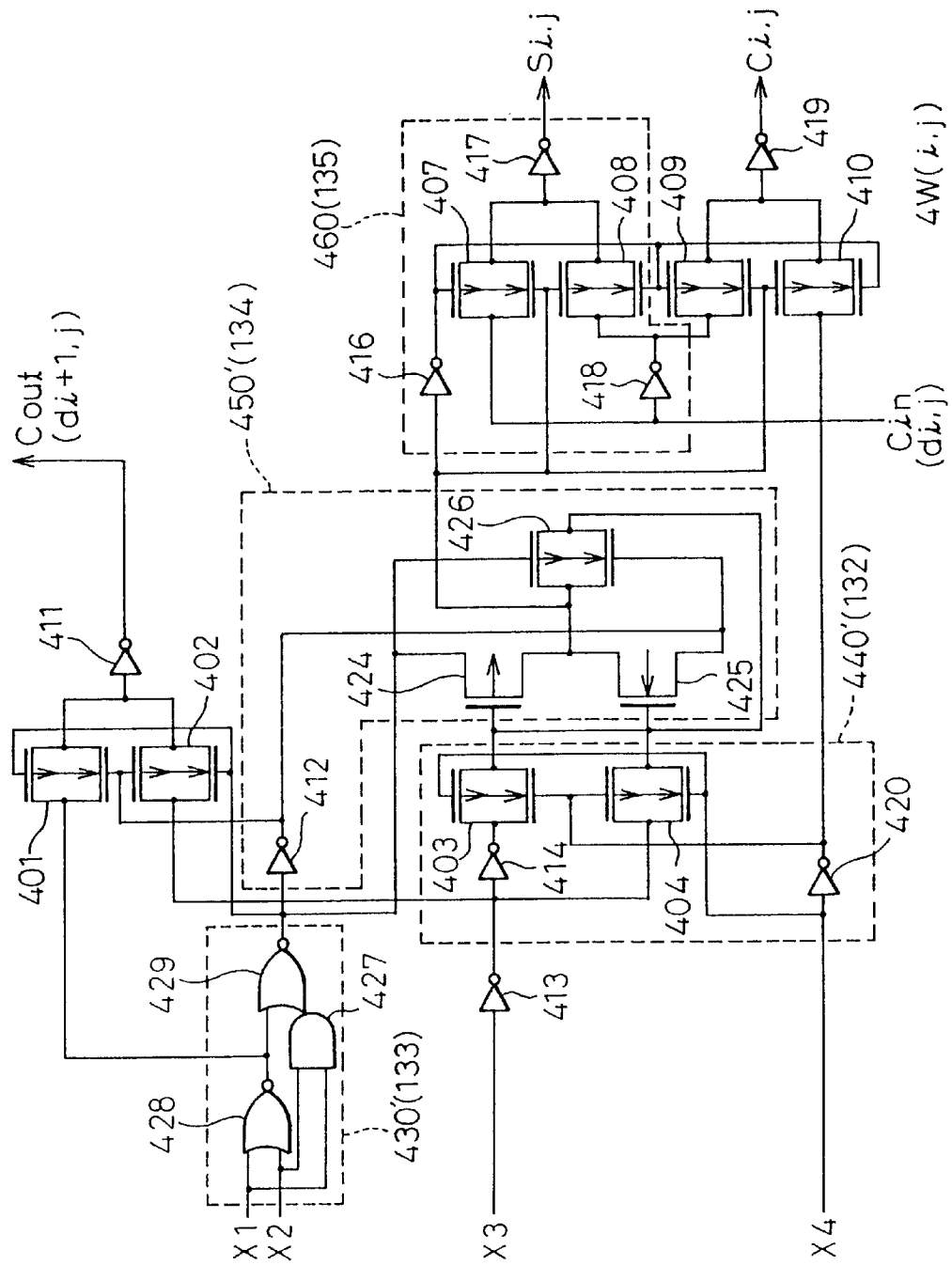
FIG. 18 is a circuit diagram showing still another embodiment of the 4-2 compression circuit constituting the Wallace tree circuit in the multiplier circuit of the present invention.

FIG. 18 is a circuit diagram showing still another embodiment of the 4-2 compression circuit constituting the Wallace tree circuit in the multiplier circuit of the present invention. In this embodiment also, the 4-2 compression circuit is constructed using 48 elements.

As shown in FIG. 18, a NOR signal of the first input signal x1 and second input signal x2 and an exclusive-OR (EOR) signal of x1 and x2 are generated, and when the EOR output (the output of the NOR circuit 429) is true (logic 1), the third input signal x3 is output as the intermediate carry-out signal (Cout), while when the EOR output is false (logic 0), a NOT signal of the NOR signal (the output of the NOR circuit 428) is output as the intermediate carry-out signal.

In the 4-2 compression circuits shown in FIGS. 16 to 18, the number of necessary elements is reduced to 50 or less, and yet the circuit is unaffected by the delay through the transfer gates explained in the description of the prior art, that is, the reduction is achieved without sacrificing the processing speed.

The third embodiment of the invention hereinafter described is concerned with a partial product bit compression method for reducing the number of partial product bits for each digit place, that can shorten the critical path in partial bit compression processing without increasing the number of necessary elements compared with the prior art.

First, features of the partial product bit compression method of the present invention will be briefly described. As a first feature, a multiplier circuit utilizing the Booth algorithm contains a circuit which, instead of a partial product bit signal in accordance with the Booth algorithm, directly generates for each digit place a bit signal corresponding to the sum of a correction value for 2's complement of the most significant partial product and a binary number represented by a bit in the sign digit of the least significant partial product and bits from the least significant digit of the most significant partial product to the digit one place lower than the sign digit of the least significant partial product. As a second feature, a multiplier circuit utilizing a method for avoiding sign extension by correction processing contains a circuit which performs the addition of a 1 for sign correction in a digit place one position higher than the sign digit of each partial product, wherein an intermediate carry-out signal as a summation output for a digit place one position lower than the digit containing the correction term, or a carry signal itself, is added in a digit place two positions higher, and an inverted signal thereof is added in a digit place one position higher, thereby apparently eliminating the addition of the 1 in the summation of bits for each place.

With the first feature of the partial product bit compression method of the invention, it becomes possible to reduce the maximum number of partial product bits without having to provide an additional circuit for 2's complement generation as required in the prior art. Further, with the second feature of the partial product bit compression method of the invention, by performing sign digit processing as part of the processing in the partial product bit compression circuit it becomes possible to reduce the number of elements in the processing circuit as a whole. Thus, in the present invention, a multiplier circuit faster than the prior art can be constructed without having to provide the additional circuitry that contributed to increasing the critical path in the Wallace tree circuit in the prior art as previously described. In this way, with the first and second features of the partial product bit compression method, the invention achieves the construction of a multiplier circuit capable of performing operations at higher speed than the prior art, while reducing the number of elements compared with the prior art.

Figure 19:
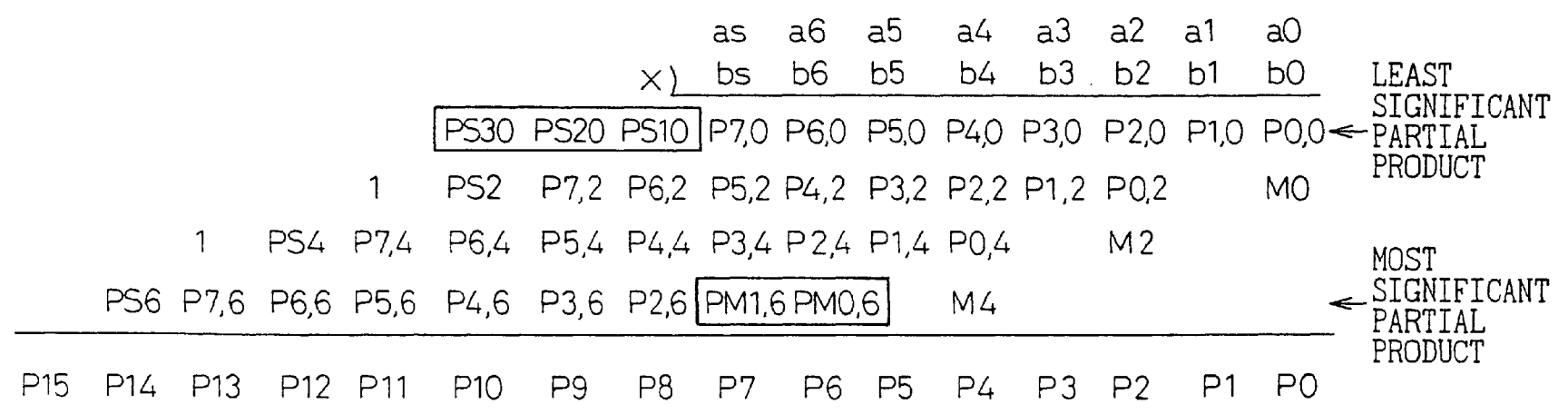

FIG. 19 is a diagram for explaining one example of the partial product bit compression method employed in the multiplier circuit of the present invention.

In FIG. 19, the above-described method (the first feature of the partial product bit compression method) is applied for multiplication of 8×8 bits utilizing the second-order Booth algorithm, as an example. By applying the third embodiment of the invention (the partial product bit compression method for the multiplier circuit), the number of partial products to be processed, usually five partial products, can be reduced to four. This, for example, allows the direct use of the 4-2 compression circuit, and leads to a reduction in circuit size. Of the partial product bits, the following five bits are affected by the application of the invention.

Most significant partial product: PM0,6 and PM1,6

Least significant partial product: PS10, PS20, and PS30
The correspondence with the original values is given by the following relation.

$$\begin{array}{cccccc} PS0 & /PS0 & /PS0 & P1,6 & P0,6 \\ +) & & & & M6 \\ \hline PS30 & PS20 & PS10 & PM1,6 & P0,6 \end{array}$$

Therefore, logic of the above five bits should be so determined as to satisfy the above relation. More specifically, the following logic expressions are determined.

| | | |
|---|---|---|
| PM0,6 | = | P0,6⊕M6 = a0 · X6 · (M6 + PL6) |
| PM1,6 | = | P1,6⊕(P0,6 · M6) |
| | = | X6 · (M6 · (a0⊕a1) + PL6 · a1) + /X6 · a0 · (M6 + PL6) |
| PC6 | = | P1,6 · P0,6 · M6 |
| | = | M6 · /a0 · (/a1 · X6 + /X6) |
| e1,6 | = | PL6 · a1 + M6 · /a1 |
| PS10 | = | PC6⊕/PS0 = PC6⊕(M0 · /as + PL0 · as) |
| PS20 | = | /PS0⊕(PC6 · /PS0) = /PC6 · /PS0 |
| PS30 | = | PS0⊕(PC6 · /PS0) = PC6 + PS0 |

Here, PC6 is a carry signal from the digit of PM1,6 to the higher-order digit, and e1,6 is a signal necessary to obtain P2,6. The least significant partial product is also included because, as can be seen from the above expressions, changing the sign digit portion of the partial product bits makes it easier to simplify the logic and enhances the effect of the reduction in the number of elements. Examples of logic circuit configurations corresponding to the above seven logic expressions are shown in FIGS. 20 and 21.

Figure 20:
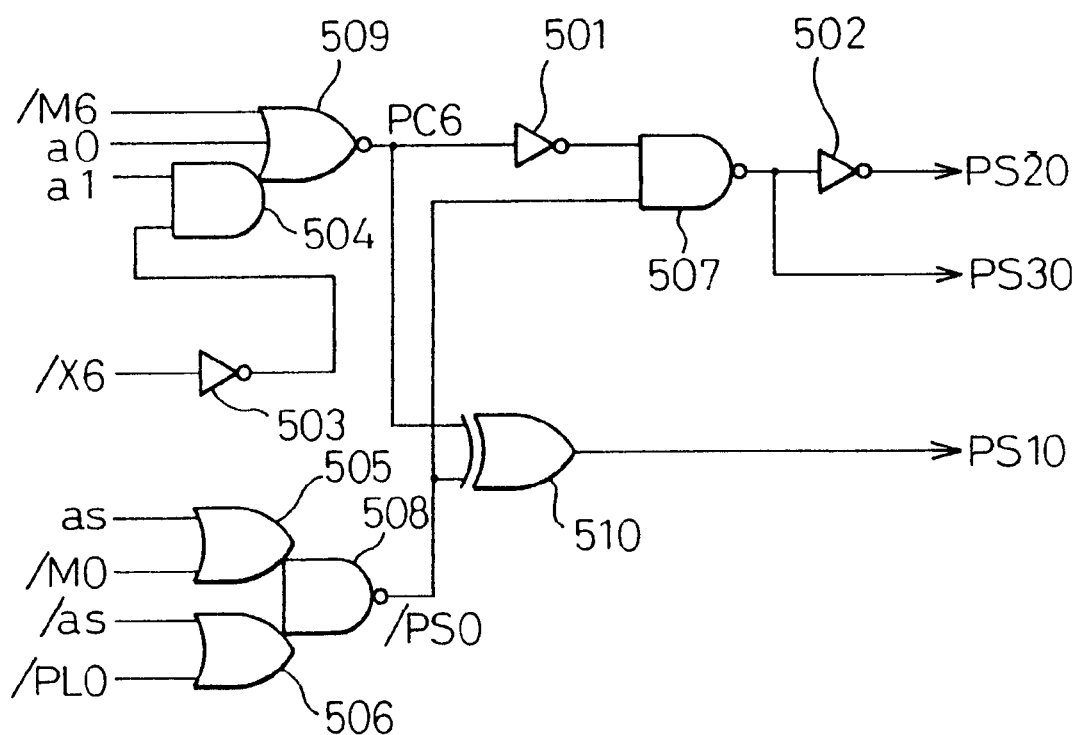
FIG. 20 is a circuit diagram (part 1) showing an embodiment for implementing the partial product bit compression method of FIG. 19.
Figure 21:
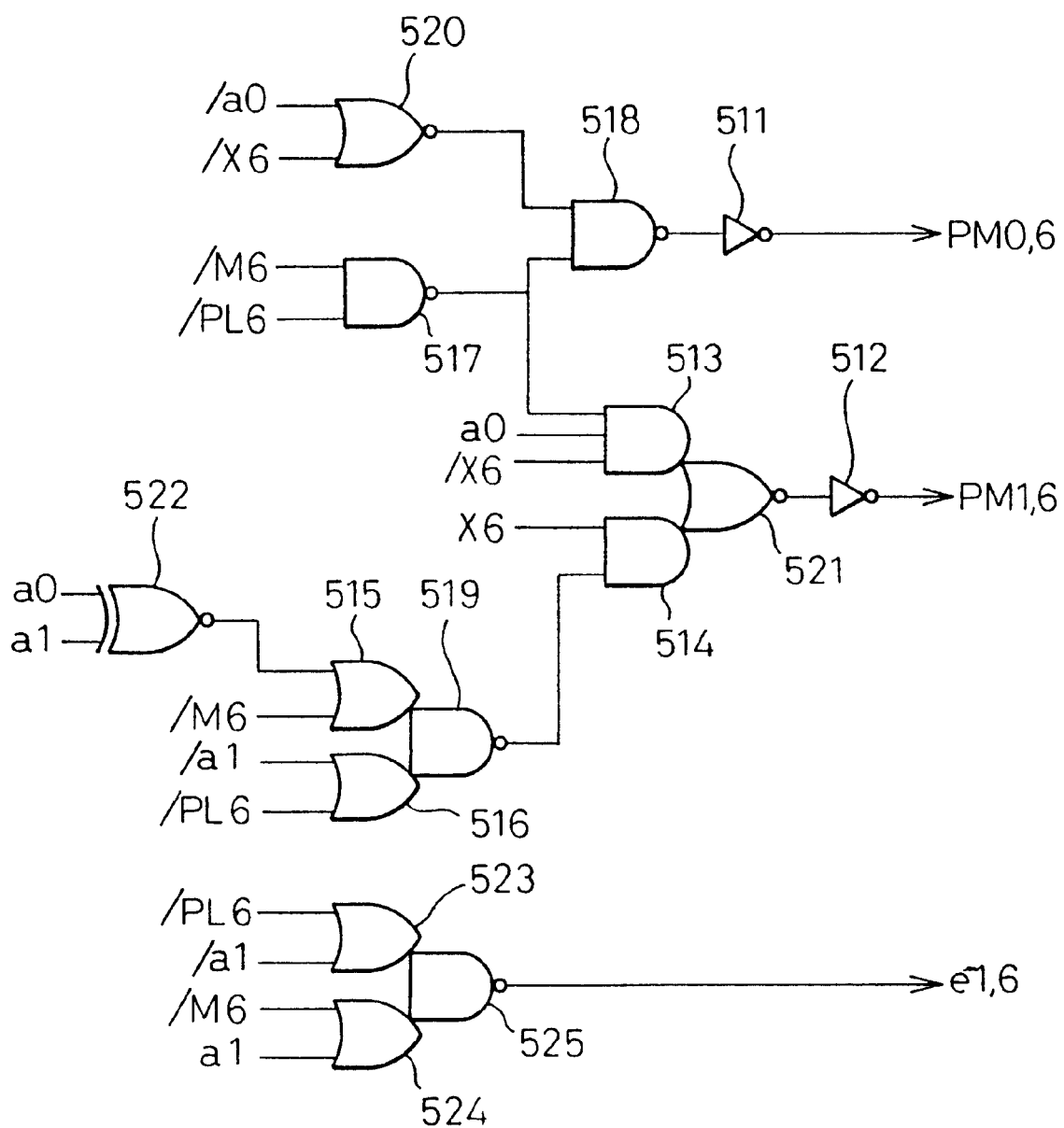
FIG. 21 is a circuit diagram (part 2) showing the embodiment for implementing the partial product bit compression method of FIG. 19.

FIGS. 20 and 21 are circuit diagrams showing one embodiment for implementing the partial product bit compression method of FIG. 19.

As shown in FIGS. 20 and 21, the logic circuits corresponding to the above seven logic expressions together comprise: five inverters 501 to 503, 511, and 512; three AND circuits 504, 513, and 514; six OR circuits 505, 506, 515, 516, 523, and 524; six NAND circuits 507, 508, 517, 518, 519, and 525; three NOR circuits 509, 520, and 521; and two EOR circuits 510 and 522, the total number of elements being 88. In some examples of the prior art, circuitry corresponding to the above circuitry is achieved with a smaller number of elements, but in the present invention, the reduction in the number of elements in the summation circuitry for compressing partial products bits for each digit place, achieved by the reduction of bits for each digit place, is far greater than the increase, which means that the number of elements as a whole is reduced.

Figure 22A:
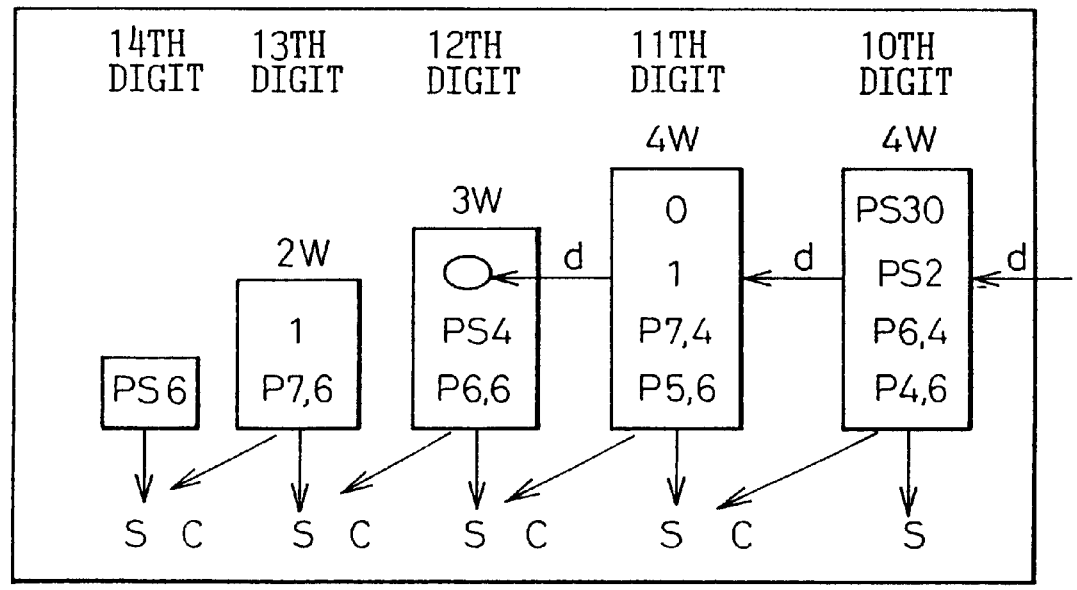
FIGS. 22A to 22B are diagrams for explaining another embodiment of the partial product bit compression method for the multiplier circuit according to the present invention by comparison with a prior art example.
Figure 22B:
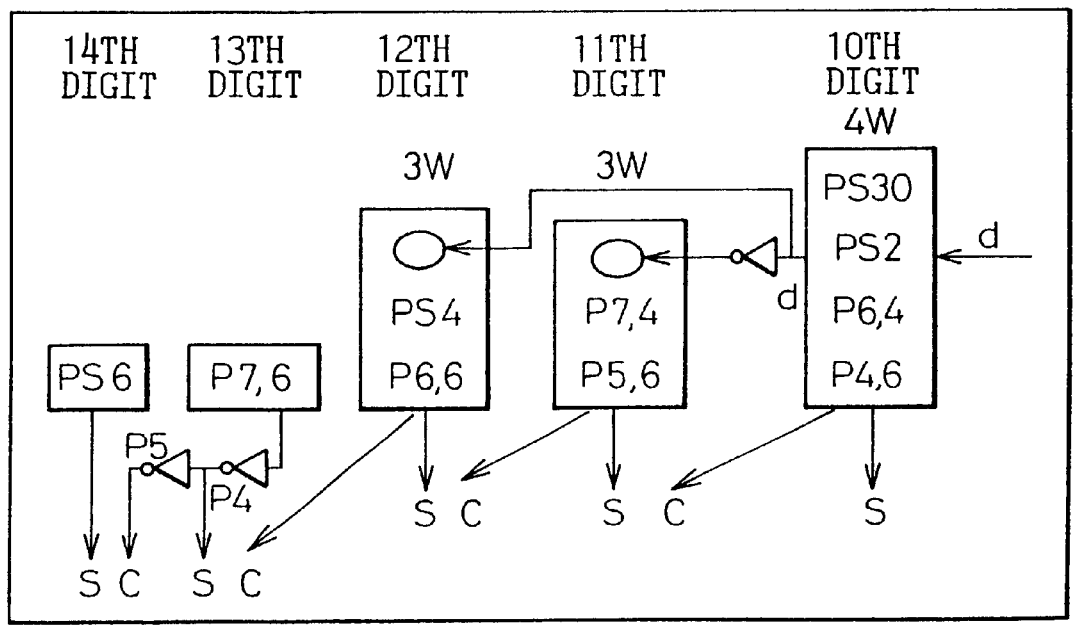

FIGS. 22A and 22B are diagrams for explaining the partial product bit compression method for the multiplier circuit according to another embodiment of the present invention by comparison with a prior art example. FIG. 22A is for explaining an example of a prior art method of partial product bit compression, and FIG. 22B is for explaining the partial product bit compression method according to the embodiment of the invention. More specifically, FIG. 22B concerns the second feature of the partial product bit compression method of the present invention described above when it is applied to bit compression in the 10th and higher digit places.

As shown in FIG. 22A, the partial product bit compression method of the prior art requires two 4-2 compression circuit (4W), a 1-bit full-adder circuit (3W), and a half-adder circuit (2W), requiring a total of 134 elements (134 transistors).

On the other hand, as shown in FIG. 22B, when the partial product bit compression method of the invention is used, the necessary circuitry can be constructed using a 4-2 compression circuit (4W), two 1-bit full-adder circuit (3W), and three inverters, i.e. a total of 102 elements (102 transistors).

As shown in FIG. 22B, according to the present invention, the intermediate carry-out signal d in the 10th digit place is input after inversion to 3W in the 11th digit place, while the same signal d is input directly to 3W in the 12th digit place for processing. The partial product bit signal P in the 13th digit place is inverted by an inverter and processed as the sum signal S, and the inverted signal of the sum signal S is processed as the carry signal C to the 14th digit place. In this way, by applying the partial product bit compression method of the invention, compression of bits in each digit place can be accomplished using fewer elements than the prior art without reducing the processing speed.

Thus, the partial product bit compression method of the third embodiment of the invention achieves a reduction in the number of partial product bits for each digit place and shortens the critical path in partial product bit compression processing without increasing the number of necessary elements compared with the prior art.

By combining the first, second, arid third embodiments of the invention described above, the number of elements can be reduced by 30 to 40% at the maximum compared with the prior art, and yet a multiplier circuit having the processing speed comparable to that of the prior art can be constructed. Furthermore, if the savings in the number of elements are used to construct additional circuits for implementing specific signal processing functions, an integrated circuit with enhanced functionality can be realized using the same manufacturing technology.

As has been described in detail above, by applying the first, second, and third embodiments of the invention in a combination suitable to the required specifications of the multiplier circuit, the multiplier circuit can be reduced in size by reducing the number of necessary elements without sacrificing its high speed capability.

Many different embodiments of the present invention may be constructed without departing from the spirit and scope of the present invention, and it should be understood that the present invention is not limited to the specific embodiments described in this specification, except as defined in the appended claims.

What is claimed is:

1. A multiplier circuit comprising:
   an encoder for receiving a multiplier bit signal and for outputting a plurality of encode signals, a partial product bit generating circuit for receiving the encoded signals along with a multiplicand bit signal from each digit place and for generating a partial product bit for each digit place, and a Wallace tree circuit, having a plurality of adder circuits, for repeatedly compressing until the number of bits for each digit place finally becomes two, wherein each of said adder circuits takes, for each digit place, four input signals and one intermediate carry-in signal, and generates one intermediate carry-out signal along with a sum signal and a carry signal for output, wherein
   an OR or NOR signal and an exclusive-OR signal of the first digit place input signal and the second digit place input signal from the same digit place are formed, and when the exclusive-OR signal is a first value, the third digit place input signal from the same digit place is the intermediate carry-out signal, while when the exclusive-OR signal is a second value, the OR or NOR signal is the intermediate carry-out signal.

2. A multiplier circuit as claimed in claim 1, wherein a circuit for generating the sum signal by exclusive-ORing the five input signals comprises:
   a first exclusive-OR circuit, constructed from a single-transfer-gate circuit, for exclusive-ORing the exclusive-OR signal of the first and second input signals with the exclusive-OR signal of the third and fourth signals from the same digit place; and
   a plurality of second exclusive-OR circuits, each constructed from a drive gate circuit or a complementary-transfer-gate circuit, for exclusive-ORing the other input signals.

3. A multiplier circuit as claimed in claim 2, wherein said first exclusive-OR circuit comprises six transistors.

4. A multiplier circuit comprising:
   an encoder for receiving a multiplier bit signal and for outputting a plurality of encode signals, a partial product bit generating circuit for receiving the encoded signals along with a multiplicand bit signal from each digit place and for generating a partial product bit for each digit place, and a Wallace tree circuit, having a plurality of adder circuits, for repeatedly compressing until the number of bits for each digit place finally becomes two, wherein each of said adder circuits takes, for each digit place, four input signals and one intermediate carry-in signal, and generates one intermediate carry-out signal along with a sum signal and a carry signal for output, wherein an AND or NAND signal and an exclusive-OR signal of the first digit place input signal and the second digit place input signal from the same digit place are formed, and when the exclusive-OR signal is a first value, the third digit place input signal from the same digit place is the intermediate carry-out signal, while when the exclusive-OR signal is a second value, the AND or NAND signal is the intermediate carry-out signal.

5. A multiplier circuit as claimed in claim 4, wherein a circuit for generating the sum signal by exclusive-ORing the five input signals comprises:

a first exclusive-OR circuit, constructed from a single-transfer-gate circuit, for exclusive-ORing the exclusive-OR signal of the first and second input signals with the exclusive-OR signal of the third and fourth signals from the same digit place; and a plurality of second exclusive-OR circuits, each constructed from a drive gate circuit or a complementary-transfer-gate circuit, for exclusive-ORing the other input signals.

6. A multiplier circuit as claimed in claim 5, wherein said first exclusive-OR circuit comprises six transistors.

7. A multiplier circuit comprising an encoder for receiving a multiplier bit signal and for outputting a plurality of encode signals, a partial product bit generating circuit for receiving the encode signals along with a multiplicand bit signal from each digit place and for generating a partial product bit for each digit place, and a Wallace tree circuit, having a plurality of adder circuits, for repeatedly compressing until the number of bits for each digit place finally becomes two, wherein each of said adder circuit takes, for each digit place, four input signals and one intermediate carry-in signal, and generates one intermediate carry-out signal along with a sum signal and a carry signal for output, wherein a circuit for generating the sum signal by exclusive-ORing the five input signals comprises:

a first exclusive-OR circuit, constructed from a single-transfer-gate circuit, for exclusive-ORing the exclusive-OR signal of the first and second input signals with the exclusive-OR signal of the third and fourth signals from the same digit place; and a plurality of second exclusive-OR circuits, each constructed from a drive gate circuit or a complementary-transfer-gate circuit, for exclusive-ORing the other signals.

8. A multiplier circuit as claimed in claim 7, wherein said first exclusive-OR circuit comprises six transistors.

9. A large-scale semiconductor integrated circuit having a multiplier circuit and additional circuitry for implementing signal processing functions, wherein said multiplier circuit comprising:

an encoder for receiving a multiplier bit signal and for outputting a plurality of encode signals, a partial product bit generating circuit for receiving the encoded signals along with a multiplicand bit signal from each digit place and for generating a partial product bit for each digit place, and a Wallace tree circuit, having a plurality of adder circuits, for repeatedly compressing until the number of bits for each digit place finally becomes two, wherein each of said adder circuits takes, for each digit place, four input signals and one intermediate carry-in signal, and generates one intermediate carry-out signal along with a sum signal and a carry signal for output, wherein an OR or NOR signal and an exclusive-OR signal of the first digit place input signal and the second digit place input signal from the same digit place are formed, and when the exclusive-OR signal is a first value, the third digit place input signal from the same digit place is the intermediate carry-out signal, while when the exclusive-OR signal is a second value, the OR or NOR signal is the intermediate carry-out signal.

10. A large-scale semiconductor integrated circuit as claimed in claim 9, wherein a circuit for generating the sum signal by exclusive-ORing the five input signals comprises:

a first exclusive-OR circuit, constructed from a single-transfer-gate circuit, for exclusive-ORing the exclusive-OR signal of the first and second input signals with the exclusive-OR signal of the third and fourth signals from the same digit place; and a plurality of second exclusive-OR circuits, each constructed from a drive gate circuit or a complementary-transfer-gate circuit, for exclusive-ORing the other input signals.

11. A large-scale semiconductor integrated circuit as claimed in claim 10, wherein said first exclusive-OR circuit comprises six transistors.

12. A large-scale semiconductor integrated circuit having a multiplier circuit and additional circuitry for implementing signal processing functions, wherein said multiplier circuit comprising:

an encoder for receiving a multiplier bit signal and for outputting a plurality of encode signals, a partial product bit generating circuit for receiving the encoded signals along with a multiplicand bit signal from each digit place and for generating a partial product bit for each digit place, and a Wallace tree circuit, having a plurality of adder circuits, for repeatedly compressing until the number of bits for each digit place finally becomes two, wherein each of said adder circuits takes, for each digit place, four input signals and one intermediate carry-in signal, and generates one intermediate carry-out signal along with a sum signal and a carry signal for output, wherein an AND or NAND signal and an exclusive-OR signal of the first digit place input signal and the second digit place input signal from the same digit place are formed, and when the exclusive-OR signal is a first value, the third input signal from the same digit place is the intermediate carry-out signal, while when the exclusive-OR signal is a second value, the AND or NAND signal is the intermediate carry-out signal.

13. A large-scale semiconductor integrated circuit as claimed in claim 12, wherein a circuit for generating the sum signal by exclusive-ORing the five input signals comprises:

a first exclusive-OR circuit, constructed from a single-transfer-gate circuit, for exclusive-ORing the exclusive-OR signal of the first and second input signals with the exclusive-OR signal of the third and fourth signals from the same digit place; and a plurality of second exclusive-OR circuits, each constructed from a drive gate circuit or a complementary-transfer-gate circuit, for exclusive-ORing the other input signals.

14. A large-scale semiconductor integrated circuit as claimed in claim 13, wherein said first exclusive-OR circuit comprises six transistors.

15. A large-scale semiconductor integrated circuit having a multiplier circuit and additional circuitry for implementing signal processing functions, wherein said multiplier circuit comprising an encoder for receiving a multiplier bit signal and for outputting a plurality of encode signals, a partial product bit generating circuit for receiving the encode signals along with a multiplicand bit signal from each digit place and for generating a partial product bit for each digit place, and a Wallace tree circuit, having a plurality of adder circuits, for repeatedly compressing until the number of bits for each digit place finally becomes two, wherein each of said adder circuit takes, for each digit place, four input signals and one intermediate carry-in signal, and generates one intermediate carry-out signal along with a sum signal and a carry signal for output, wherein a circuit for generating the sum signal by exclusive-ORing the five input signals comprises:

- a first exclusive-OR circuit, constructed from a single-transfer-gate circuit, for exclusive-ORing the exclusive-OR signal of the first and second input signals with the exclusive-OR signal of the third and fourth signals from the same digit place; and
- a plurality of second exclusive-OR circuits, each constructed from a drive gate circuit or a complementary-transfer-gate circuit, for exclusive-ORing the other signals.

16. A large-scale semiconductor integrated circuit as claimed in claim 15, wherein said first exclusive-OR circuit comprises six transistors.

* * * * *